United States Patent [19]
Williams et al.

[11] Patent Number: 5,751,862
[45] Date of Patent: May 12, 1998

[54] SELF-TIMED TWO-DIMENSIONAL FILTER

[75] Inventors: Dawn M. Williams, Webster; Stuart A. Schweid, Henrietta, both of N.Y.

[73] Assignee: Xerox Corporation, Stamford, Conn.

[21] Appl. No.: 643,427

[22] Filed: May 8, 1996

[51] Int. Cl.$^6$ .................................................. G06K 9/00
[52] U.S. Cl. .......................... 382/260; 382/254; 358/448; 358/456
[58] Field of Search ..................... 382/260, 261, 382/262, 263, 264, 265, 254; 358/447, 448, 455, 456, 458

[56] References Cited

U.S. PATENT DOCUMENTS

| | | | |
|---|---|---|---|
| 4,328,426 | 5/1982 | D'Ortenzio | 250/578 |
| 4,602,285 | 7/1986 | Beaulier et al. | 358/160 |
| 4,667,304 | 5/1987 | Hier et al. | 364/825 |
| 4,700,324 | 10/1987 | Doi et al. | 364/745 |
| 4,760,605 | 7/1988 | David et al. | 382/47 |
| 4,766,561 | 8/1988 | Thompson et al. | 364/724 |
| 4,777,612 | 10/1988 | Tomimitsu | 364/724.13 |
| 4,821,223 | 4/1989 | David | 364/724.05 |
| 4,862,403 | 8/1989 | Iwase et al. | 364/724 |
| 5,027,423 | 6/1991 | Kawata et al. | 382/54 |
| 5,068,905 | 11/1991 | Hackett et al. | 382/47 |
| 5,131,059 | 7/1992 | Kobayashi et al. | 382/50 |
| 5,151,953 | 9/1992 | Landeta | 382/41 |
| 5,245,445 | 9/1993 | Fujisawa | 358/458 |
| 5,387,985 | 2/1995 | Loce et al. | 358/447 |

*Primary Examiner*—Thomas D. Lee
*Attorney, Agent, or Firm*—Michael J. Nickerson

[57] ABSTRACT

A filter for filtering digital image data includes a timing circuit to convert received line sync signal and a received page sync signal to a new line sync signal and a new page sync signal and a N×M filter to filter digital data based on the new line sync signal, the new video valid signal and the new page sync signal. N is a value representing a filter dimension in a slow scan direction, and M is a value representing a filter dimension in a fast scan direction. The timing circuit causes the self-timed image processing device to output $(N-1)/2$ scanlines of unfiltered digital image data after the received page sync signal indicates an end of an input page.

14 Claims, 17 Drawing Sheets

SELF-TIMED TWO-DIMENSIONAL FILTER

FIELD OF THE PRESENT INVENTION

The present invention relates generally to a digital signal processing apparatus, and more particularly to the implementation of a two-dimensional digital filter which is self timed.

BACKGROUND OF THE PRESENT INVENTION

In the reproduction of images from an original document or images from video image data, and more particularly, to the rendering of image date representing an original document that has been electronically scanned, one is faced with the limited resolution capabilities of the rendering system and the fact that output devices are mostly binary or require compression to binary for storage efficiency. This is particularly evident when attempting to reproduce halftones, lines, and continuous tone (contone) images.

An image data processing system may be tailored so as to offset the limited resolution capabilities of the rendering apparatus, but this tailoring is difficult to the divergent processing needs required by different types of images which may be encountered by the rendering device. In this respect, it should be understood that the image content of the original document may consist entirely of multiple image types, including high frequency halftones, low frequency halftones, continuous tones (contones), line copy, error diffused images, etc. or a combination of any of the above, and some unknown degree of some or all of the above or additional image types.

In view of the situation, optimizing the image processing system for one image type in an effort to offset the limitations in the resolution and the depth capability of the rendering apparatus may not be possible, requiring a compromised choice which may not produce acceptable results. Thus, for example, where one optimizes the system for low frequency halftones, it often at the expense of degraded rendering of high frequency halftones, or of line copy, and visa versa.

To address this particular situation, "prior art" devices have utilized automatic image segmentation to serve as a tool to identify different image types or imagery. For example, in one such system, image segmentation was addressed by applying a function instructing the image processing system as to the type of image data present, in particularly, an auto-correlation function to the stream of pixel data to determine the existence of halftone image data. Such a method automatically processes a stream of image pixels representing unknown combinations of high and low frequency halftones, contones, and/or lines. The auto-correlation function was applied to the stream of image pixels, and for the portions of the stream that contain high frequency halftone image data, the function produced a large number of closely spaced peaks in the resultant signal.

In another auto segmentation process, an auto-correlation function is calculated for the stream of halftone image data at selected time delays which are predicted to be indicative of the image frequency characteristics, without prior thresholding. Valleys in the resulting auto-correlated function are detected to determine whether high frequency halftone image is present.

An example of a "prior art" automatic segmentation circuit is illustrated in FIG. 15. The basic system as shown in FIG. 15 is made up of three modules. Input information stored in a data buffer 10 is simultaneously directed to an image property classifying section 20, the first module, and an image processing section 30, the second module. The image property classifying section 20, is made up of any number of submodules, (e.g. auto-correlator 21 and discriminator 22), which determine whether a block image pixels stored in the data buffer 10 is one type of imagery or another, (e.g. halftone, line/text, or contone). In parallel with the image property classifying section 20, the image processing section 30 is made up of any number of sub-processing sections, (e.g. high frequency halftone processor 31 low frequency halftone processor 32, line/text processor 33, or contone processor 34), which perform image processing operations on the same block of image pixels as section 20. Each image sub-processing section performs image processing operations that are adapted to improve the image quality of a distinct class of imagery. The third module, controls section 40, uses the information derived from the image classifying section 20, to control the image processing section 30.

The decision as to what class of imagery a block of image data belongs to is typically binary in nature. For example, in a conventional image segmentation scheme image property classifying section 20 classifies each pixel as one of three classes of imagery, (high frequency halftone, low frequency halftone, or contone). Depending on those classification, each pixel is processed according to the properties of that class of imagery, (either low pass filter and re-screening if it's a high frequency halftone, threshold with a random threshold if it is a low frequency halftone, etc.). Also, assuming that the decision as to which of the three classes of imagery a pixel belongs is based on a single image property, the peak count of the input image data, the resulting image classification decision of the peak count image property is made by thresholding the peak count into three classes of imagery as shown in FIG. 16.

Consequently, the control section 40 decides the type of image processing a block of image pixels requires depending on the decision made by the classification section 20. Thus, the output of classification section 20 is quantized to one of three possibilities. The control section 40 selects the output from one of the three image sub-processing sections based upon this classification.

Image classification decisions using thresholds are usually artificially abrupt since an image can change from one class of imagery to another slowly and gradually. This abrupt decision making, which produces a forced choice among several distinct alternative choices, is a primary reason for the formation of visible artifacts in the resulting output image. Most transition points or thresholds are selected so that an image can be classified as one class of imagery with a high degree of certainty; however, those classes of imagery that cannot be classified with such certainty have multiple transition points or a transition zone. Using only one point to define a transition zone results in the formation of visible artifacts in the resulting output image. Although it is possible to make the transition zone narrower so that there is less chance that an image falls into the zone, there exists limitations on how narrow the zone can be made.

In general, the "prior art" describes the control section 40 as essentially having a switch as illustrated in FIG. 17. Since the image processing steps performed for each class of imagery are different depending on the classification given to each block of input image pixels, the switch or multiplexer allows data residing at the output of the image processor 30 to be directed to an output buffer 50 depending on the decisions made by the imagery classifying section 20 which are received as signals on lines 23 and 24. This type of binary decision making is rigid and results in image segmentation decisions that do not fail gracefully and consequently form visible artifacts in the output image.

To address this forming of visible artifacts in the rendered output image, it has been proposed to utilize a probabilistic segmentation process to allow the image processing system to fail more gracefully when incorrect segmentation decisions are made. An example of such a probabilistic segmentation system is illustrated in FIG. 11.

FIG. 11 shows a block diagram of a conventional image processing system which incorporates a probabilistic classification system. As illustrated in FIG. 11, the conventional system receives input image data derived from any number of sources, including a raster input scanner, a graphics workstation, an electronic memory, or other storage elements, etc. In general, the image processing system shown in FIG. 11 includes probabilistic classifier 25, image processing section 30, an image processing and control mixer 41.

Input image data is made available to the image processing system along data bus 15, which is sequentially processed in parallel by probabilistic classifier 25 and image processing section 30. Probabilistic classifier 25 classifies the image data as a ratio of a number of predetermined classes of imagery. The ratio is defined by a set of probability values that predict the likelihood the image data is made up of a predetermined number of classes of imagery. The probabilities 27, one for each predetermined class of imagery, are input to the image processing mixer or control unit 41 along with image output data from image processing section 30.

Image processing section 30 includes units 31, 32, and 34 that generate output data from the image data in accordance with methods unique to each predetermined class of imagery. Subsequently, mixer 41 combines a percentage of each class of output image data from units 31, 32, and 34 according to the ratio of the probabilities 27 determined by classifier 25. The resulting output image data for mixer 41 is stored in output buffer 50 before subsequent transmission to an image output terminal such as a printer or display.

Initially, the stream of image pixels from an image input terminal (IIT) is fed to data buffer 10. The image data stored in buffer 10 is in raw grey format, for example, 6 to 8 bits per pixel. A suitable block size is 16 pixels at 400 spots per inch, or 12 pixels at 300 spots per inch. Too large a sample size has a tendency to cause a blurred result, while too small a sample size does not contain a sufficient amount of data for a good sample.

With reference FIG. 12, the conventional probabilistic classifier 25 is shown in detail. The block of image pixels stored in buffer 10 is transmitted to a characteristic calculator 28 through data buffers 15. Calculator 28 provides an output value that characterizes a property of the image data transmitted from buffer 10, such as its peak count. In one embodiment, a characteristic value is determined by calculator 28 that represents the peak count of the block of image data. The peak count is determined by counting those pixels whose values are the non-trivial local area maximum or minimum in the block of image data. First local area maximum or minimum pixel values are selected depending on whether the average value of all the pixels in the block of image data is higher or lower than the median value of the number of levels of each pixel.

After calculator 28 evaluates the peak count of the image data, probability classifier 29 determines three probability values 27 that correspond to each image type associated with the peak count as expressed by the characteristic function stored in memory 26. The characteristic function, determined with apriori image data, represents a plurality of probability distributions that are determined using a population of images. Each probability distribution depicts the probability that a block of image data is a certain type given the occurrence of an image property, a peak count. For example, the characteristic function stored in memory 26 can be represented by the graph shown in FIG. 13, which relates the probability distributions for a contone 1, low frequency halftone 2, and high frequency halftone 3 to the occurrence of a particular image characteristic, which in this example is a peak count. The characteristic function stored in memory 26 can be adjusted using input control 18. Using control 18, the resulting output image stored in buffer 50 can be altered by modifying the characteristic function representing the different classes of imagery evaluated by the image processing system 30.

Subsequently, probability classifier 29 determines each probability value by evaluating the probability distribution of each image type represented by the characteristic function stored in memory 26. After determining the probability values, classifier 29 outputs these results to image processing mixer or control 41.

The image processing section of FIG. 11 operates concurrently with the probabilistic classifier 25 on the image data stored in buffer 10. Image processing section 30 includes a high frequency halftone processing unit 31, a low frequency halftone processing unit 32, and a contone processing unit 34. Each processing unit processes all image data in accordance with a particular image type. Each of the processing units 31, 32, and 34 generates output blocks of unquantized video data.

Image processing control 41 mixes the data output blocks to form a composite block of output image signals that is stored in output buffer 50. The manner in which the output blocks are mixed is characterized by a ratio defined by the probability determined by the probabilistic classifier 25.

FIG. 14 shows the conventional image processing mixer 41 in detail. Mixer 41 multiplies the output blocks with the probability, using multipliers 42, 43, 44. The resulting output from each multiplier is representative of a percentage or ratio of each output block, the sum of which defines a composite block of output image signals. The composite block of output image signals is formed by adding the output of the multipliers using adder 45 and by subsequently quantizing the sum of adder 45 using quantizer 47. The resulting image block output by quantizer 47 is stored in output buffer 50 before subsequent transmission for output to an image output terminal having limited resolution or depth.

The above-described image classification system utilizes a probabilistic approach to classify the image data. Such an approach presents problems in that the classification of the image data is mutually exclusive, the image data is classified as a particular type in absolute terms eventhough the probability of the decision being correct is just over 50%. This results in difficulties in trying to design an image processing system which will process the image data without visible artifacts in the rendered image when the decision on the image type does not have a high confidence.

Therefore, it is desirable to implement an image classification system which provides a truer classification of the image type and the image types are not necessarily mutually exclusive. Such a system would incorporate fuzzy logic, thereby allowing image data to be classified as being a member of more than one image class. This feature is critical in areas where the image goes from one image type to another. Moreover, it is desirable to implement a image processing system which takes advantage of the fuzzy classification system.

One important component of the rendering system is digital filtering. The digital filtering process should be both efficient and low cost. Moreover, the filter design should have some non-separable and/or time-varying characteristics so that the filter can be used in a fuzzy segmentation system. However, trying to achieve one goal or another can adversely impact the other goal. Various approaches have been devised for the implementation of digital filtering techniques which try to solve minimize the adverse impacts. These techniques will be discussed briefly below.

In one "prior art" digital filtering technique, a circuit performs a plurality of finite impulse response filtering functions. The circuit comprises a plurality of filters, each implementing a predetermined digital filter algorithm. A storage circuit stores coefficients and data operands utilizing the predetermined algorithm. An arithmetic unit is coupled to the storage circuit for performing predetermined arithmetic operations with selected coefficients and data operands. A sequencing control device sequentially selects operands from the storage circuit for input to the arithmetic unit.

In another "prior art" digital filtering technique, a digital signal processing apparatus provides high speed digital filtering. This apparatus includes at least two digital filters in parallel and a multiplexer for alternately outputting the outputs to the filters. In a third "prior art" device, a two-dimensional finite impulse response filter having a plurality of filter portions of essentially identical construction are arranged in a parallel configuration. A de-multiplexer separates an input data signal comprising consecutive digital words and supplies each digital word in sequence to a separate filter portion. Subsequently, a multiplexer, coupled to the output of the filter portions, selectively outputs the filtered data from each filter portion in a sequence corresponding to the order of separation of the input data, thereby resulting in a filtered version of the original input data.

The three systems described above all have the limitation with respect to either speed or high cost. In view of these limitations, it has been proposed to provide a plurality of one-dimensional transform units that may be selectively combined with an additional one-dimensional transform unit to produce a plurality of distinct two-dimensional filters, any one of which is selectable on a pixel by pixel basis. Moreover, this proposed conventional system has the added advantage of providing two-dimensional finite impulse response filters without employing multiple, identically constructed two-dimensional filters arranged in a parallel fashion, thereby substantially reducing the complexity and cost of the filter hardware. To get a better understanding of this conventional system, the conventional system will be described below.

The conventional system, as illustrated in FIG. 1, includes image processing module 20 which generally receives offset and gain corrected video through input line 22. Subsequently, the image processing module 20 processes the input video data according to control signals from CPU 24 to produce the output video signals on line 26. As illustrated in FIG. 1, the image processing module 20 may include an optional segmentation block 30 which has an associated line buffer 32, two-dimensional filters 34, and an optional one-dimensional effects block 36. Also included in image processing module 20 is line buffer memory 38 for storing the context of incoming scanlines.

Segmentation block 30, in conjunction with the associated scanline buffer 32, automatically determines those areas of the image which are representative of halftone input region. Output from the segmentation block, (video class), is used to implement subsequent image processing effects in accordance with a type or class of video signals identified by the segmentation block. For example, the segmentation block may identify a region containing data representative of an input halftone image, in which case a lowpass filter would be used to removed screen patterns, otherwise, a remaining text portion of the input video image may be processed with an edge enhancement filter to improve fine line and character reproduction when thresholded.

Two-dimensional filter block 34 is intended to process the incoming, corrected video in accordance with the predetermined filtering selection. Prior to establishment of the required scanline content, the input video bypasses the filter by using a bypass channel within the two-dimensional filter hardware. This bypass is necessary to avoid delirious effects to the video stream that may result from filtering of the input video prior to establishing the proper context.

Subsequent to two-dimensional filtering, the optional one-dimensional effects block is used to alter the filtered, or possibly unfiltered, video data in accordance with selected one-dimensional video effects. One-dimensional video effects include, for example, thresholding, screening, inversion, tonal reproduction curve (TRC), pixel masking, one-dimensional scaling, and other effects which may be applied one-dimensionally to the steam of video signals. As in the two-dimensional filter, the one-dimensional effects blocks also includes a bypass channel where no additional effects would be applied to the video, thereby enabling the received video to be passed through as an output video.

FIG. 2 illustrates the hardware of the two-dimensional filter of the conventional device described above. The hardware provides two independent finite impulse response, (FIR), or convolution filters. Each filter allows for the use of a center pixel adjust coefficient although filter coefficients must be symmetric in both the fastscan and slowscan directions. The filter coefficients are programmable and may be set to zero to employ the use of a smaller filter.

Each filter processes a predetermined number of input scanlines at a time pixel by pixel, to calculate each output scanline. As previously described with respect to FIG. 1, input scanlines are buffered in line buffer 38 to meet the filter input requirements. In addition, if the two-dimensional filter 34 is used with segmentation block 30 of FIG. 1, the filter must operate one scanline later than the segmentation block.

As illustrated in FIG. 2, input video is provided to slowscan filters 102A and 102B, from line buffer memory 38 of FIG. 1. Also provided to filters 102A and 102B are the associated slowscan filter coefficient, as contained in slowscan filter coefficient memory 104A and 104B, respectively. The slowscan filter coefficients are arranged in a symmetric fashion about a center scanline coefficient. The output of slowscan filters 102A and 102B is directed to slowscan filter context buffers 106A and 106B, respectively. The output from the slowscan filter context buffers 106A and 106B are fed to a multiplexer 208 which selects between which output is to be processed by a fastscan filter 230.

The selection by the multiplexer is controlled by the class type of the video data being processed which was determined by the segmentation block 30 of FIG. 1. The fastscan filter coefficients to be utilized by the fastscan filter 230 are received from one of a plurality of fastscan filter coefficient buffers wherein the context of the buffers are fed into a multiplexer 242 that selects the proper filter coefficients based on the class or image type of the video being processed.

The above-described two-dimensional filter provides a filtering technique that is efficient; however, the filter is not time-varying as would be required if the image processing system utilized a fuzzy segmentation process. Therefore, it is desirable to design a digital filter that is non-separable and/or time-varying so that it can readily implemented in a fuzzy segmentation system. Moreover, it is desirable to design a time-varying filter that is self-timed and which is cascadable so as to enable proper filtering of the image data and provide scalability.

SUMMARY OF THE PRESENT INVENTION

One aspect of the present invention is a self-timed image processing device for filtering digital image data. The filter includes a timing circuit to convert received line sync signal and a received page sync signal to a new line sync signal and a new page sync signal and a N×M filter to filter digital data based on the new line sync signal, the new video valid signal and the new page sync signal. N is a value representing a filter dimension in a slow scan direction, and M is a value representing a filter dimension in a fast scan direction. The timing circuit causes the self-timed image processing device to output (N−1)/2 scanlines of unfiltered digital image data after the received page sync signal indicates an end of an input page.

Another aspect of the present invention is a method for filtering digital image data. The method receives line sync signals, a page sync signal, and a plurality of scanlines of digital image data. A N×M filter is used to filter the received scanlines of digital image data and to output filtered digital image data. The filtering function is bypassed when the received page sync signal indicates a beginning of an input page and ((N−1)/2)+1 line sync signals have been received.

A third aspect of the present invention is a filter. The filter includes a plurality of buffers to receive digital image data filtered and filter means for filtering the received digital image data and outputting the digital image data based on a state of a received page sync signal and received line sync signals. The filter means filters the received digital data and outputting filtered digital image data when the received page sync signal indicates an input page is being received and when N line sync signals have been received, N being a value representing a filter dimension in a slow can direction.

A fourth aspect of the present invention is a method for filtering. The method buffers received digital image data, filters the received digital data and outputs filtered digital image data when a received page sync signal indicates an input page is being received and when N line sync signals have been received, N being a value representing a filter dimension in a slow scan direction.

Further objects and advantages of the present invention will become apparent from the following descriptions of the various features of the present invention.

BRIEF DESCRIPTION OF THE DRAWINGS

The following is a brief description of each drawing used in describing the present invention, thus, the drawings are being presented for illustrative purposes only and should not be limitative of the scope of the present invention, wherein.

DETAILED DESCRIPTION OF THE PRESENT INVENTION

Figure 1:
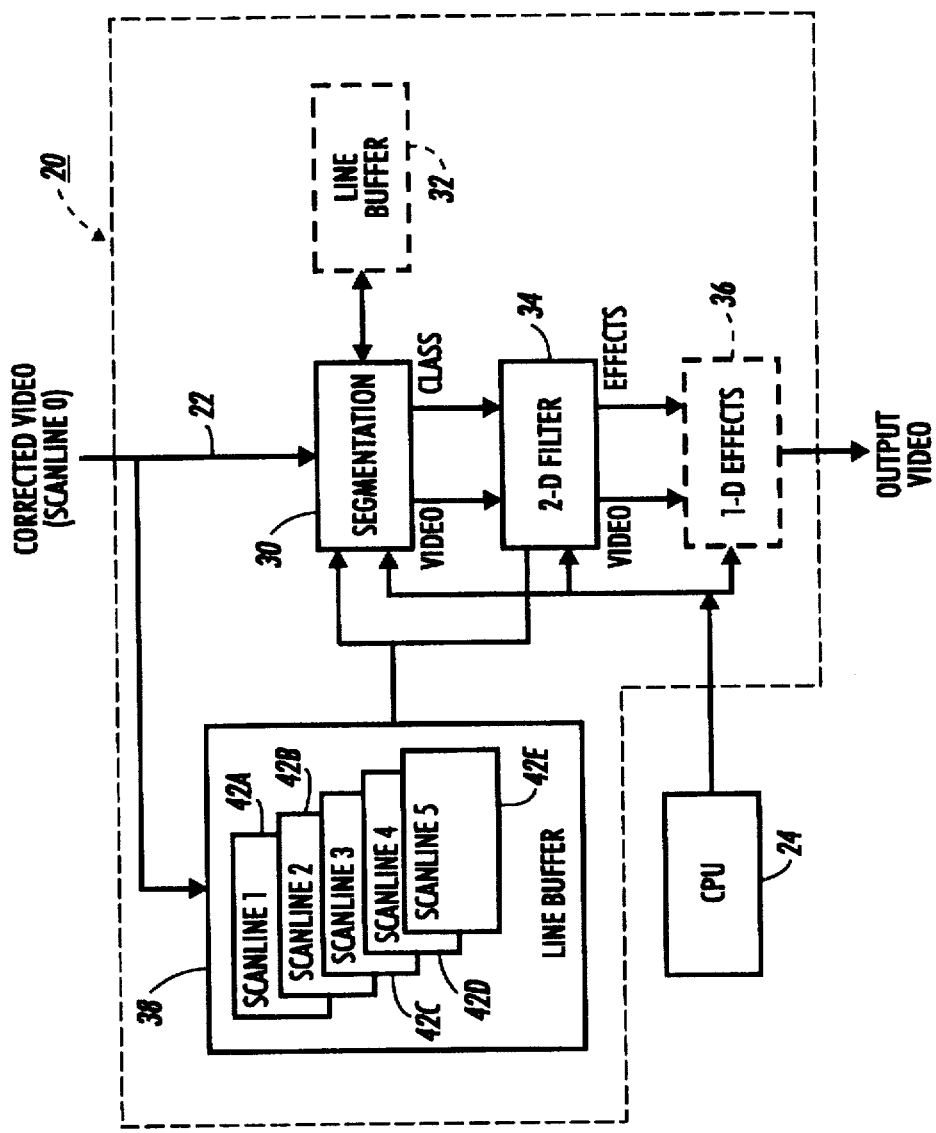
FIG. 1 is a schematic illustration of a conventional image processing hardware module incorporating a two-dimensional filter.
Figure 2:
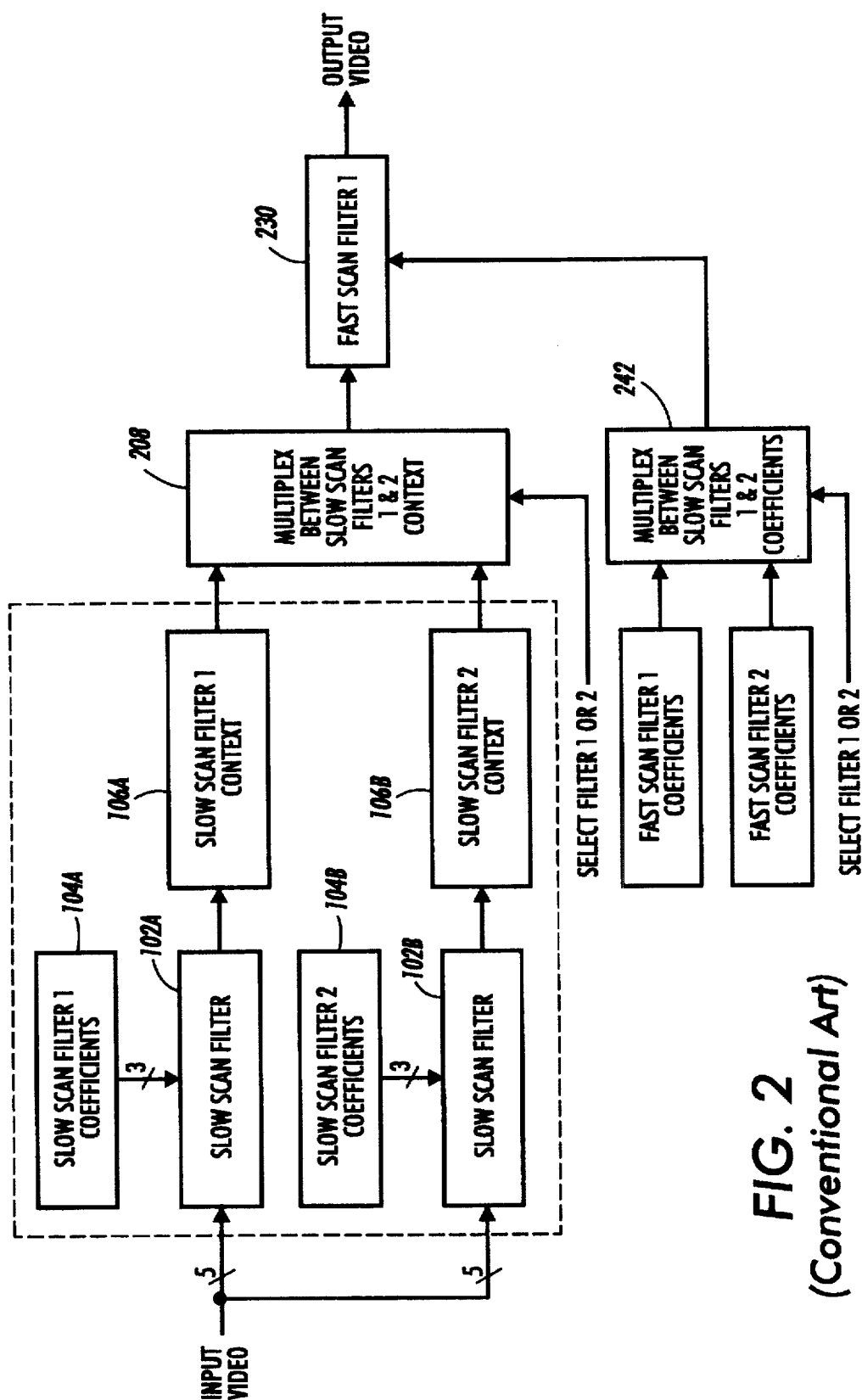
FIG. 2 is a block diagram illustrating the reduced hardware component set used in the conventional image processing two-dimensional filter of FIG. 1.

The following will be a detailed description of the drawings illustrated in the present invention. In this description, the terms "image data" or "pixels" in the form of video image signals, which may be either analog or digital voltage representations of an image, indicate a representation of an image provided from a suitable source. For example, the image signals may be obtained through line by line scanning of an image bearing the original by one or more photosensitive elements, such as a multiple photosite array of charge couple devices commonly referred to as CCDs. Line by line scanning of an image bearing the original for the duration of image data is well known and does not form a part of the present invention.

Image data may also be derived by a computer workstation program in accordance with document creation application software or from a data storage device. In content, the original video image signals may be composed entirely of a single image component such as lines, text, low frequency halftones, high frequency halftones, contones, or any combination thereof.

The following description also includes references to slowscan and fastscan digital image data when discussing the directionality of two-dimensional filtering architecture. For purposes of clarification, fastscan data is intended to refer to individual pixels located in a succession along a raster of image information, while slowscan data refers to data derived from a common raster position across multiple rasters or scanlines.

As an example, slowscan data would be used to describe signals captured from a plurality of elements along a linear photosensitive array as array is moved relative to a document. On the other hand, fastscan data would refer to the sequential signals collected along the length of the linear photosensitive array during a single exposure period which is also commonly referred to as a raster of data.

Moreover, in describing the present invention, it is assumed that the video signal has a value in a range between 0 and 255. However, any range from the video signal can be utilized in conjunction with the present invention. Furthermore, in the following description, the term "grey level" will be used to describe both black and white and color applications.

Furthermore, in describing the present invention, the term "pixel" will be utilized. This term may refer to an electrical, (or optical, if fiber optics are used), signal which represents the physical measurable optical properties at a physical definable area on a receiving medium. The receiving medium can be any tangible document, photoreceptor, or marking material transfer medium.

Moreover, the term "pixel" may refer to an electrical, (or optical, if fiber optics are used), signal which represents the physically measurable optical properties at a physically definable area on the display medium. A plurality of the physically definable areas for both situations represent the physically measurable optical properties of an entire physical image to be rendered by either a material marking device, electrically or magnetic marking device, or optical display device.

Lastly, the term "pixel" may refer to an electrical, (or optical, if fiber optics are used), signal which represents physical optical property data generated from a signal photosensor cell when scanning a physical image so as to convert the physical optical properties of the physical image to an electronic or electrical representation. In other words, in this situation, a pixel is an electrical, (or optical), representation of the physical optical properties of a physical image measured at a physical definable area on a optical sensor.

Many of the documents produced today are compound documents in that the documents are composed of several different sub-images that are of different image types or image classes. Some of the common types are text, photos (contones), and halftones. One reason for the increased appearance of compound documents is the widespread use of commercially available word processing and desktop publishing software that is able to generate them.

As is well known, different types of images require different processing in order to provide optimal image quality. Conventionally, to automatically choose the best processing for different areas of an image, each area is classified into one of several pre-defined classes to determine how to render that part of the image. This image type or image class information can then be used to determine the appropriate processing required to obtain a good rendition of the image when printing, to choose a method of image compression, to determine if optical character recognition would be useful, etc.

However, as noted previously, the classification process should not be so crisp so as to avoid problems when the input image is not very similar to any of the classes, or the input images properties straddle the border between two classes.

For example, if a particular action is taken based upon a single class identification because the classes are mutually exclusive, it may create undesirable results for a non-prototype image. This is seen when rendering images for printing on a xerographic printer. The classification of the image can cause output artifacts such as when a halftone image is classified as a contone image.

Another type of problem is that adjacent areas of the image may be classified differently due to small variations in the image. This is called class switching. If this information is used for image enhancement and printing, the output may have objectionable artifacts due to local variations. Examples of these objectionable artifacts are grainy image outputs.

To eliminate the above described problems, an image classification system which utilizes a fuzzy membership into each category or class can be used. In other words, the classes in a fuzzy classification system are not mutually exclusive, thereby eliminating problems with class switching and also allowing those areas to have processing different than that of any of the other pre-defined classes; i.e., the output can choose between a continuum of possible image processing techniques.

In standard classification techniques, each area has one class assigned to it. In the fuzzy implementation of the present invention, each area has a classification vector assigned to it. Every element of the classification vector has a membership value associated with each of the pre-defined prototype classes.

Similar to the creation of crisp classifiers, a set of heuristic rules are used to determine the form of the classifier. The following is an example of how heuristic rules are used to create a fuzzy classifier, according to the concepts of the present invention.

For illustrative purposes, an example of a two class non-fuzzy system is discussed. In this example, the system only classifies a particular region as either contone (i.e., grey pictorial) or text. An image may be considered text if there are a lot of edges and most pixels are black or white. If this is not true, the picture is considered contone.

In order to determine edges, a variable relating to the Laplacian of the image data at every point (pixel) is used. A typical implementation for this type of segmentation may be if the summation of the squares of the Laplacian at every pixel in the subblock is greater than a predetermined summation threshold and the sum of the percentage of pixels with grey value less than a black threshold value and the percentage of pixels with grey value greater than a white threshold value is greater than a predetermined bi-modal threshold, the image is text, else the image is contone.

In this example, since the parameters are device dependent, tests, which are known to those skilled in the art, would be run to determine the values of all of the parameters; the percentage of pixels with grey value less than a black threshold value, the percentage of pixels with grey value greater than a white threshold value, the summation threshold, and the bi-modal threshold before executing the segmentation routine. Note that only one class can be chosen, either text or contone.

In order to implement a fuzzy classifier, according to the concepts of the present invention, several modifications must be made to the above described heuristic rules. As described above, there exists a single rule defining only text. If the condition for text is "not true," contone is chosen. In the fuzzy system of the present invention, contone must have it's own rule, since the text membership rule is not an absolute truth, but a relative truth that the classification is true.

Moreover, even providing a rule for contones will not satisfy the excluded middle law; therefore, a third "other" class must be added to satisfy the constraints of fuzzy logic. Without the "other" class, it would be possible to have membership of the image in all classes be very small. Thus, the "other" class creates a lower bound of a half (0.5) for the minimum membership in any given class. A minimum magnitude for the maximum membership assures that all actions/decisions made using the relative membership values are not extremely sensitive to the class memberships, which they would be if membership in all classes was small, thereby making the fuzzy classification more robust.

In the fuzzy classification scheme of the present invention, the pixel or unit of image data has a membership in each of the three classes; text, image and "other." In other words, the pixel is no longer considered to be an element of just one of the mutually exclusive classes. However, if the determination for one class reach absolute certainty; i.e. the membership in a single class is 1 and the other classes is zero; the fuzzy system does generate values which would represent a crisp system.

In view of this non-exclusivity characteristic of the pixel image membership, the membership of the pixel is represented by a membership vector, $V_i$, whose entries correspond to the membership of the pixel (image element) in each of the classes. Note, typically, there are no constraints on this vector other than all of it's elements must be greater than or equal to 0 and less than or equal to 1. However, since the fuzzy classification rules of the present invention have been setup with a third "other" class, at least one of the elements of the vector must be greater than or equal to 0.5 and less than or equal to 1.

Using the two class example above, the fuzzy classification rules would be the following. If the summation of the squares of the Laplacian at every pixel in the subblock is greater than a predetermined summation threshold and the sum of the percentage of pixels with grey value less than a black threshold value and the percentage of pixels with grey value greater than a white threshold value is greater than a predetermined bi-modal threshold, the pixel would be assigned a membership value for the "text" class which is the minimal value associated with each of the conditional statements.

To better understand this concept, the following brief explanation of fuzzy logic will be provided. In fuzzy logic, unlike Boolean logic, the results of the conditional statements do not generate either absolute true or absolute false, but a value corresponding to the amount of the resulting statement which is true. This result is due to the fact that the conditional statements are also not absolute.

For example, in the above described rule, from testing, it may be determined that the midpoint (predetermined target condition value) of the fuzzy Laplacian summation condition should be 50. The midpoint represents maximum uncertainty as to whether the value 50, in this example, is a member of the class Large Laplacian. Moreover, from testing, it is determined that, with absolute certainty, a pixel is member of the Large Laplacian (membership equals 1.0) if the summation is equal to or greater than 75 (predetermined absolute condition value) and it is determined that, with absolute certainty, a pixel is not a member of the Large Laplacian (membership equals 0.0) if the summation is equal to or less than 25 (predetermined absolute condition value). Fuzzy logic allows the classifier to assign 0.5 (conditional value) to a result where the summation is 50 and linearly extrapolate to the assigned values (conditional values) to 1 and 0.0 for the values 75 and 25, respectively; i.e., value 55 would be assigned a membership value of 0.6. Note that these values are device dependent, and thus, the midpoint and the range needs to be determined for each individual device.

Furthermore, from testing, it may be determined that the midpoint of the class bi-modal should be 80; with absolute certainty, a pixel is in the membership if the percentage sum is equal to or greater than 90; and, with absolute certainty, a pixel is not in the membership if the percentage sum is equal to or less than 70. Fuzzy logic allows the classifier to assign 0.5 to a result where the sum value is 80 and linearly extrapolate to the assigned values to 1 and 0.0 for the values 90 and 70, respectively; i.e., value 85 would be assigned a membership value of 0.75. Note that these values are device dependent, and thus, the midpoint and the range needs to be determined for each individual device.

To further explain the fuzzy technique, it is assumed that the membership values for each conditional statement are 0.5 and 0.33, respectively. In this scenario, the membership value for the pixel for the class text would be 0.33 because fuzzy logic treats "anded" statements as determining the minimal value for all the conditions and assigning the minimal value to the membership value.

Using the contone rule of if the summation of the squares of the Laplacian at every pixel in the subblock is less than a predetermined summation threshold and the sum of the percentage of pixels with grey value less than a black threshold value and the percentage of pixels with grey value greater than a white threshold value is less than a predetermined bi-modal threshold, the image is "contone," each conditional statement will be discussed in fuzzy logic terms.

For example, in the above described rule, from testing, it may be determined that the midpoint of the fuzzy Laplacian summation condition should be 50. Moreover, from testing, it is determined that, with absolute certainty, a pixel is in the membership if the summation is equal to or less than 25 and it is determined that, with absolute certainty, a pixel is not in the membership if the summation is equal to or greater than 75. Fuzzy logic allows the classifier to assign 0.5 to a result where the summation is 50 and linearly extrapolate to the assigned values to 1 and 0.0 for the values 25 and 75, respectively; i.e., value 55 would be assigned a membership value of 0.4.

Furthermore, from testing, it may be determined that the midpoint of the fuzzy bi-modal condition should be 80; with absolute certainty, a pixel is in the membership if the sum is equal to or less than 70; and, with absolute certainty, a pixel is not in the membership if the sum is equal to greater 90. Fuzzy logic allows the classifier to assign 0.5 to a result where the percentage value is 80 and linearly extrapolate to the assigned values to 1 and 0.0 for the values 70 and 90, respectively; i.e., value 85 would be assigned a membership value of 0.25.

To further explain the fuzzy technique, it is assumed that the membership values for each conditional statement are 0.75 and 0.8, respectively. In this scenario, the membership value for the pixel for the class text would be 0.75 because fuzzy logic treats "anded" statements as determining the minimal value for all the conditions and assigning the minimal value to the membership value.

Lastly, the fuzzy rules states that if image is neither "text" or "contone," the image is "other." This last rule, which defines the "other" class, can be represented mathematically as, $\mu_{other}(\text{image}) = \min(1-\mu_{text}(\text{image}), 1-\mu_{contone}(\text{image}))$ where $\mu_x(Y)$ is the membership of Y in the class X. Note that if $\mu_{text}(\text{image})$, and $\mu_{contone}(\text{image})$ are smaller than 0.5 then $\mu_{other}(\text{image})$ will be greater than 0.5 (as stated earlier). In the example, given above, $\mu_{text}(\text{image})$ is equal to 0.33 and $\mu_{contone}(\text{image})$ is equal to 0.75, thus, $\mu_{other}(\text{image})$ would be equal to 0.25, with the resulting membership vector being [0.33 0.75 0.25]. Note the element values of the vector need not add up to 1.

The predicate of each the rules described above is extended to a fuzzy truth instead of an absolute truth to provide the element value for the membership vector. Thus, in order to make the inequality "Y is >X" a fuzzy truth, a membership function is defined for ">X". Similarly, a fuzzy membership rule can be defined for<X (very often, the membership in (<X) is equal to not (>X): (1-membership of (>X)).

For simplicity in implementation, the membership in (>X) is defined as follows:

$$\mu_{>X}(Y) = \begin{cases} 1, & Y > X + \Delta X, \\ 0, & Y \le X - \Delta X, \\ (Y - X + \Delta X)/(2\Delta X), & X - \Delta X < Y \le X + \Delta X \end{cases}$$

The value of $\Delta X$ determines the level of fuzzification of the class; if $\Delta X$ is extremely small, then the definition reduces to the crisp definition of greater than. It is further noted that although the fuzzification has been described as a linear relationship, the function describing the values between the end points and the mid point may be any type of function. Moreover, the midpoint could represent absolute certainty in the class and have a membership value of 1 and the endpoints represent absolute certainty of non-membership such that the membership values would graphically form a triangle with the midpoint being the peak.

Returning to the multiple "If's" in the above rules, the membership of image in the class text is equal to the fuzzy value of the predicate, $\mu_{text}(\text{image})=\min(\mu_{>Slp\ Threshold}(\Sigma lp^2)$ $\cdot \mu_{>Bimodal\ Threshold}(\text{White}+\text{Black}))$.

To expand the concepts of the present invention to the processing of images on a typical xerographic laser printer requires separating images into several classes; for example, white, black, edge, pictorial, low frequency halftone, mid frequency halftone, high frequency halftone and other, etc. The classes white, black, and pictorial are subclasses of the set "contone" and low frequency halftone, mid frequency halftone, high frequency halftone are subclasses of the set "halftone."

In a preferred embodiment of the present invention, the deterministic values for determining membership are as follows:

BLACK_%=the percentage of pixels with grey value less than a black threshold value;

WHITE_%=the percentage of pixels with grey value greater than a white threshold value;

Sij=Sum of the absolute values of the Laplacians in a window around the pixel being classified;

Range=Max grey Level-Min grey level inside a window around the pixel being classified; and Freq=Measurement of local 2-D frequency around the pixel being classified.

To determine the membership value in a particular class, these values are compared to a variety of predetermined thresholds in a similar manner as described above with respect to the three class system. The various classes in this preferred embodiment are demonstrated by the following rules:

If (Sij is >SIJ_HALFTONE and RANGE is >RANGE_HALFTONE and FREQ is >FREQ_HALFTONE), then C1 is HALFTONE;

If (Sij is >SIJ_EDGE and RANGE is >RANGE_EDGE and FREQ is <FREQ_HALFTONE), then pixel is EDGE;

If (Sij is <SIJ_HALFTONE and FREQ is <FREQ_HALFTONE), then C1 is CONTONE;

If (C1 is CONTONE and BLACK_% is >BLACK_THRESHOLD), then pixel is BLACK;

If (C1 is CONTONE and WHITE_% is >WHITE_THRESHOLD), then pixel is WHITE;

If (C1 is CONTONE and BLACK_% is <BLACK_THRESHOLD and WHITE_% is >WHITE_THRESHOLD), then pixel is PICTORIAL;

If (C1 is HALFTONE and FREQ is <LOW_FREQ), then pixel is LOW_FREQ_HALFTONE;

If (C1 is HALFTONE and FREQ is >LOW_FREQ and FREQ is <HIGH_FREQ), then pixel IS MID_FREQ_HALFTONE; and If (C1 is HALFTONE and FREQ is>HIGH_FREQ), then pixel is HIGH_FREQ_HALFTONE; and If (pixel is not BLACK and pixel is not WHITE and pixel is not PICTORIAL and pixel is not EDGE and pixel is not LOW_FREQ_HALFTONE and pixel is NOT MID_FREQ_HALFTONE and pixel is not HIGH_FREQ_HALFTONE), then pixel is OTHER.

The predicate of each the rules described above is extended to a fuzzy truth instead of an absolute truth to provide the element value for the membership vector. Thus, in order to make the inequality "Y is >X" a fuzzy truth, a membership function is defined for ">X". Similarly, a fuzzy membership rule can be defined for <X (very often, the membership in (<X) is equal to not (>X): (1-membership of (>X)).

For simplicity in implementation, the membership in (>X) is again defined as follows:

$$\mu_{>X}(Y) = \begin{cases} 1, & Y > X + \Delta X, \\ 0, & Y \le X - \Delta X, \\ (Y - X + \Delta X)/(2\Delta X), & X - \Delta X < Y \le X + \Delta X \end{cases}$$

The value of $\Delta X$ determines the level of fuzzification of the class; if $\Delta X$ is extremely small, then the definition reduces to the crisp definition of greater than. It is further noted that although the fuzzification has been described as a linear relationship, the function describing the values between the end points and the mid point may be any type of function. Moreover, the midpoint could represent absolute certainty in the class and have a membership value of 1 and the endpoints represent absolute certainty of non-membership such that the membership values would graphically form a triangle with the midpoint being the peak. This type of class could be used for a membership function of the class "=X".

Returning to the multiple "If's" in the above rules, the membership value of image in the class "edge" would be equal to the fuzzy value of the predicate, $\mu_{edge}$(image)=min ($\mu_{>Slp\ Threshold}$ ($\Sigma$lp), $\mu_{>Range\ Threshold}$(Max$_{grey}$-Min$_{grey}$), $\mu_{<Freq\ Threshold}$(2D Freq)); the membership value of image in the class "black" would be equal to the fuzzy value of the predicate, $\mu_{black}$(image)=min ($\mu_{<Slp\ Threshold}$ ($\Sigma$lp), $\mu_{<Freq\ Threshold}$(2D Freq), $\mu_{>Black\ Threshold}$(% of black pixels)); the membership value of image in the class "white" would be equal to the fuzzy value of the predicate, $\mu_{white}$(image)=min ($\mu_{<Slp\ Threshold}$ ($\Sigma$lp), $\mu_{<Freq\ Threshold}$(2D Freq), $\mu_{<White\ Threshold}$(% of white pixels)); the membership value of image in the class "pictorial" would be equal to the fuzzy value of the predicate, $\mu_{pictorial}$(image)=min($\mu_{<Slp\ Threshold}$ ($\Sigma$lp), $\mu_{<Freq\ Threshold}$(2D Freq), $\mu_{<Black\ Threshold}$(% of black pixels), $\mu_{<White\ Threshold}$(% of white pixels)); the membership value of image in the class "low frequency halftone" would be equal to the fuzzy value of the predicate, $\mu_{lowfreqhalf}$(image)=min($\mu_{Slp\ Threshold}$ ($\Sigma$lp), $\mu_{>Range\ Threshold}$(Max$_{grey}$-Min$_{grey}$), $\mu_{>Freq\ Threshold}$(2D Freq), $\mu_{<LowFreq\ Threshold}$(2D Freq)); the membership value of image in the class "mid frequency halftone" would be equal to the fuzzy value of the predicate, $\mu_{midfreqhalf}$(image)=min ($\mu_{>Slp\ Threshold}$ ($\Sigma$lp), $\mu_{>Range\ Threshold}$ (Max$_{grey}$-Min$_{grey}$), $\mu_{>Freq\ Threshold}$(2Freq), $\mu_{>LowFreq\ Threshold}$ (2D Freq), $\mu_{<HighFreq\ Threshold}$(2D Freq)); and the membership value of image in the class "high frequency halftone" would be equal to the fuzzy value of the predicate, $\mu_{highfreqhalf}$(image)=min($\mu_{Slp\ Threshold}$ ($\Sigma$lp), $\mu_{>Range\ Threshold}$(Max$_{grey}$-Min$_{grey}$), $\mu_{>Freq\ Threshold}$(2D Freq), $\mu_{>HighFreg\ Threshold}$(2D Freq)).

To implement the fuzzy segmentation process for the two image class situation, image data received from the image source is divided into blocks of pixels. The fuzzy image classifier then, to determine a membership value for a particular image type, calculates the summation of the squares of the Laplacians in a window around the pixel being classified. Moreover, the fuzzy classifier calculates the percentage of pixels that have a grey value less than a predetermined black value and determines the percentage of pixels within the block which have a grey value greater than a predetermined white value.

After calculating this information, the fuzzy classifier determines the conditional value for the condition relating to the summation of the squares of the Laplacian of every pixel in the block being greater than a Laplacian threshold and the conditional value for the condition relating to the sum of the percentage of pixels with a grey value greater than the predetermined black value and the percentage of the pixels with a grey value greater than the predetermined white value is greater than a bi-modal threshold value. Upon determining these two conditional values, the fuzzy classifier determines the minimal value and assigns this value as the membership value for the pixel in the "text" class.

The fuzzy classifier then determines the conditional value for the condition relating to the summation of the squares of the Laplacian of every pixel in the block is less than a Laplacian threshold value and the conditional value for the condition relating to the summation of the percentage of the pixels with a grey value less than a predetermined black value and the percentage of the pixels with a grey value greater than the predetermined white value is less the bi-modal threshold value. Upon determining these two conditional values, the fuzzy classifier determines the minimal value and assigns this value as the membership value for the pixel in the "contone" class.

The fuzzy classifier thereafter determines the membership value for the pixel in the "other" class by determining the minimal value between 1—the "text" membership value and 1—the "contone" membership value and assigns this value as the membership value for the pixel in the "other" class.

In this process, the pixels of image data received by the fuzzy classifier are assigned membership values for the three possible fuzzy classifications, "text," "contone," or "other." As noted above, the utilization of the "other" class is necessary in order to avoid having membership of the image in all classes to be very small.

An example of implementing fuzzy classification for a laser xerographic printer, will now be discussed, more specifically, a process, carried out by a fuzzy classifier, to assign membership values to the pixels of image data for eight possible types or classes.

As with the process described above, the process begins by dividing the pixels of image data into blocks of pixels. Thereafter, each block of pixels is analyzed to determine the sum of the absolute values of the Laplacians in a predetermined window around the pixel being presently analyzed; to determine a range value which is equal to the maximum grey level minus the minimum grey level inside the predetermined window around the pixel being presently analyzed; to determine a frequency value which is equal to the measurement of the local two-dimensional frequency around the pixel being presently analyzed; to determine a black value which is equal to the percentage of pixels that have a grey value less than a predetermined black value; and to determine a white value which is equal to the percentage of pixels within the window having a grey value greater than a predetermined white value.

Once these various values are determined, the fuzzy classifier begins the assigning of the membership values. The fuzzy classifier determines the conditional value for the condition relating to the sum of the absolute values of the Laplacian in the predetermined window around the pixel being presently analyzed being greater than a halftone threshold, the conditional value for the condition relating to the range value being greater than a range halftone threshold, and the conditional value for the condition relating to the frequency value being greater than a frequency halftone threshold. Upon determining these three conditional values, the fuzzy classifier determines the minimal value and assigns this value as the membership value for the pixel in the "halftone" class.

Then, the fuzzy classifier determines the conditional value for the condition relating to the summation of the absolute values of the Laplacians in the predetermined window around the pixel being presently analyzed being greater than an edge threshold, the conditional value for the condition relating to the range value being greater than a range edge threshold, and the conditional value for the condition relating to the frequency value being less than the frequency halftone threshold. Upon determining these three conditional values, the fuzzy classifier determines the minimal value and assigns this value as the membership value for the pixel in the "edge" class.

The fuzzy classifier thereafter determines the conditional value for the condition relating to the sum of the absolute values of the Laplacians in the predetermined window around the pixel being presently analyzed being less than the halftone threshold and the conditional value for the condition relating to the frequency value being less than the frequency halftone threshold. Upon determining these two conditional values, the fuzzy classifier determines the minimal value and assigns this value as the membership value for the pixel in the "contone" class.

The fuzzy classifier then determines the conditional value for the condition relating to the pixel being a contone image and the conditional value for the condition relating to the black value being greater than a black threshold value. Upon determining these two conditional values, the fuzzy classifier determines the minimal value and assigns this value as the membership value for the pixel in the "black" class.

Subsequently, the fuzzy classifier determines the conditional value for the condition relating to the pixel being a conitone image and the conditional value for the condition relating to the white value being greater than the predetermined white threshold. Upon determining these two conditional values, the fuzzy classifier determines the minimal value and assigns this value as the membership value for the pixel in the "white" class.

The fuzzy classifier determines the conditional value for the condition relating to the pixel being a halftone image and the conditional value for the condition relating to the frequency value being less than a low frequency threshold value. Upon determining these two conditional values, the fuzzy classifier determines the minimal value and assigns this value as the membership value for the pixel in the "low frequency halftone" class.

Thereafter, the fuzzy classifier determines the conditional value for the condition relating to the pixel being a halftone image, the conditional value for the condition relating to the frequency value being greater than the low frequency threshold value, and the conditional value for the condition relating to the frequency value being less than a high frequency threshold value. Upon determining these three conditional values, the fuzzy classifier determines the minimal value and assigns this value as the membership value for the pixel in the "mid frequency halftone" class.

The fuzzy classifier determines the conditional value for the condition relating to the pixel being a halftone image, the conditional value for the condition relating to the frequency value being greater than the high frequency threshold value. Upon determining these two conditional values, the fuzzy classifier determines the minimal value and assigns this value as the membership value for the pixel in the "high frequency halftone" class.

Lastly, the fuzzy classifier determines the membership value for the pixel in the "other" class by determining the minimal value between 1—the "edge" membership value, 1—the "black" membership value, 1—the "white" membership value, 1—the "pictorial" membership value, 1—the "low frequency halftone" membership value, 1—the "mid frequency halftone" membership value, and 1—the "high frequency halftone" membership value and assigns this value as the membership value for the pixel in the "other" class.

By utilizing these processes, the fuzzy image classifier can eliminate problems with class switching in areas between two or more pre-defined types. In other words, these processes implement a fuzzy classification scheme which allows the defining of various image types or classes to fail gracefully. Moreover, by implementing a fuzzy classification process, the fuzzy process allows the fuzzy memberships to have enhancement, different than any of the pre-defined classes. More specifically, the image processing system can choose between a continuum of possible processing operations to produce an output.

The present invention also allows the determination of output parameters such as filter coefficients and screening level given a fuzzy classification vector and a corresponding desired output for each prototype class. The present invention can also accommodate output types that must satisfy certain constraints (such as the mean gain of the filter) through the use of the "other" class. The fuzzy image processing greatly attenuates switching noise common in crisp decision image segmentation processes.

Processing image data for laser printer reproduction requires the implementation of two separate actions: image processing to enhance, through manipulation, which does not result in loss of information, such as filtering and TRC translation; and a lossy conversion of the resultant image to a representation accepted by a print engine, normally a reduction in the number of bits per pixel through either application of a screen or error diffusion. By utilizing a fuzzy classification scheme, the present invention can easily unify the processing implied by all of the partial memberships into a single processing action.

For example, each of the classes, defined using fuzzy classification, is provided with an ideal processing scheme. This ideal image processing scheme would represent the image processing techniques used if the membership in that class was one (1.0) and all other classes had a membership of zero (0.0). The fuzzy image classification process, described above, provides the mechanism for determining the output for a given fuzzy membership because the output is a vector. Thus, fuzzy classification can be used to choose each element of the vector independently, thereby, as noted above, providing a continuum of possible image processing operations. However, this continuum is not directly conducive to determining screening operations and determining filter coefficients. More specifically, a screening operation, by its nature, is discrete; either a screen is applied or it isn't. At every point, a comparison is made between the image data (video level) and the screen value (screen level) to determine if a pixel is to be turned OFF or ON. Thus, on its face, screening would appear to be a poor candidate for fuzzy classification control because of its inability to be applied at differing levels.

The other problem arises with determining filter coefficients. Image processing requires that the filter coefficients sum to 1 (i.e., a constant grey level in produces the same grey level out). If there is the choice between several filters, their combination may no longer meet this requirement.

The present invention resolves the first situation, the problem with applying a screen in a fuzzy classification environment, by replacing the screening operation with a linear operation that provides the same effect. Instead of comparing all video to a pre-defined screen, a 2-D sinusoidal type function, with a maximum amplitude at 45 degrees, is added to the incoming video. A more detailed explanation of this type of screening is disclosed in a co-pending U.S. patent application, Ser. No. 08/285,328. The entire contents of this co-pending U.S. patent application, Ser. No. 08/285, 328, are hereby incorporated by reference.

This screen, referred to as hybrid screening, creates video that is more likely to cluster output pixels in an error diffusion process. This clustering of video is the effect that is very pleasing to the human eye in constant or near constant grey areas. It is the clustering effect that makes this screened output superior to a straight non-screened error diffused output.

The frequency characteristics of the 2-D hybrid screen determines the approximate line pair per inch (lpi) dot pattern seen in the output; however, the ability to collect pixels into large dots, the desired effect in a screening process, is dependent on the screen's amplitude. This amplitude, a scalar, can be modified easily using the fuzzy image classification process of the present invention. All of the rules can assign a level (i.e., amplitude) of screening (large, medium, small or none, etc.). The size and frequency of the screen are predetermined to match the characteristics of the printer.

The image processing of an image using a fuzzy classification process is very similar to the fuzzy classification process itself. For example, in the screening case, the fuzzy image processing method would establish three screening classes (large, medium, and none) to determine the screen value to be applied to pixel. Each of these classes would have a set of rules as in the fuzzy classification method to determine the membership value for the pixel in the screening processing class. The membership value would then be used to calculate the actual screen amplitude which will be described in more detail below.

In a preferred embodiment of the present invention, the rules for the screening classes are as follows:

If (pixel is "edge" or pixel is "low frequency halftone" or pixel is "mid frequency halftone" or pixel is "other"), then screen is NO_SCREEN;

If (pixel is "black" or pixel is "white"), then screen is MEDIUM_SCREEN; or

If (pixel is "pictorial" or pixel is "high frequency halftone"), then screen is FULL_SCREEN.

Referring to the multiple "If's" in the above rules, the membership value of image in the class "NO_SCREEN" would be equal to the fuzzy value of the predicate, $\mu_{NO\_SCREEN}$(screen)=max($\mu_{edge}$(pixel), $\mu_{lowfreqhalftone}$(pixel), $\mu_{midfreqhalftone}$(pixel), $\mu_{other}$(pixel)); the membership value of image in the class "MEDIUM_SCREEN" would be equal to the fuzzy value of the predicate, $\mu_{MEDIUM\_SCREEN}$(screen) =max($\mu_{black}$(pixel), $\mu_{white}$(pixel)); and the membership value of image in the class "FULL_SCREEN" would be equal to the fuzzy value of the predicate, $\mu_{FULL\_SCREEN}$(screen)= max($\mu_{pictorial}$(pixel), $\mu_{highfreqhalftone}$(pixel)).

To implement the fuzzy screening, the processing system determines the membership value of the pixel in each of the classes associated with a particular screening process and assigns the maximum value as the membership value in the screening class. For example, if the pixel had membership values for "edge," "low frequency halftone," "mid frequency halftone," and "other" of 0.6, 0.7, 0.2, and 0.3, respectively, the processing system would decode the membership vector and assign a membership value to the NO_SCREEN class of 0.7. Moreover, if the pixel had membership values for "black" and "white" of 0.6 and 0.5, respectively, the processing system would decode the membership vector and assign a membership value to the MEDIUM_SCREEN class of 0.6. Lastly, if the pixel had membership values for "pictorial" and "high frequency halftone" of 0.3 and 0.4, respectively, the processing system would decode the membership vector and assign a membership value to the FULL_SCREEN class of 0.4.

To determine the actual amplitude for the screen value, the fuzzy processing module, in the preferred embodiment of the present invention, multiply the membership value for each screen class with the ideal coefficient for that class and divide the product by the sum of the membership values. In the preferred embodiment, the NO_SCREEN coefficient is 0, MEDIUM_SCREEN coefficient is 0.5, and FULL_SCREEN coefficient is 1.0. Thus, in the example described above, the screen amplitude for the pixel being processed would be equal to a scalar value of 0.412 (((1.0*0.4)+(0.5*0.6)+(0.0*0.7))/(0.4+0.6+0.7)).

Figure 19:
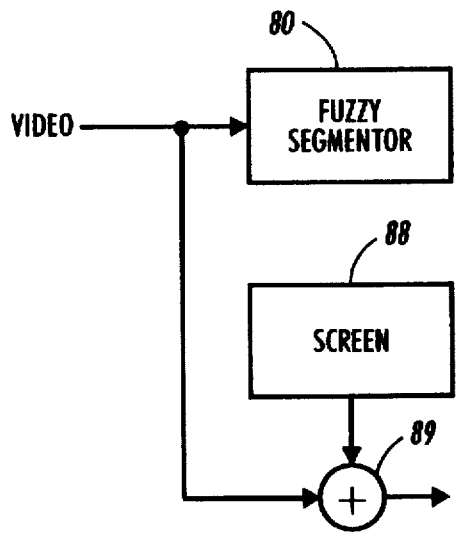
FIG. 19 is a block diagram illustrating a screening system incorporating the fuzzy classification process of the present invention.

An example of the application of fuzzy classification to screening is illustrated in FIG. 19. As illustrated in FIG. 19, the video signal or image data is fed into a fuzzy classifier 80 which classifies the image data according to the rules described above. The fuzzy image classifier 80 then generates a membership vector which is passed onto a screening generating circuit 88. The screen generating circuit 88 produces a screen value which is added to the image data at adder 89. The image data which is summed with the screen value corresponds to the same pixel as was classified by the fuzzy image classifier 80. In other words, the system illustrated in FIG. 19 also includes buffers (not shown) to insure that the pixel being processed corresponds to the correct membership vector being used to define the processing parameters.

Figure 20:
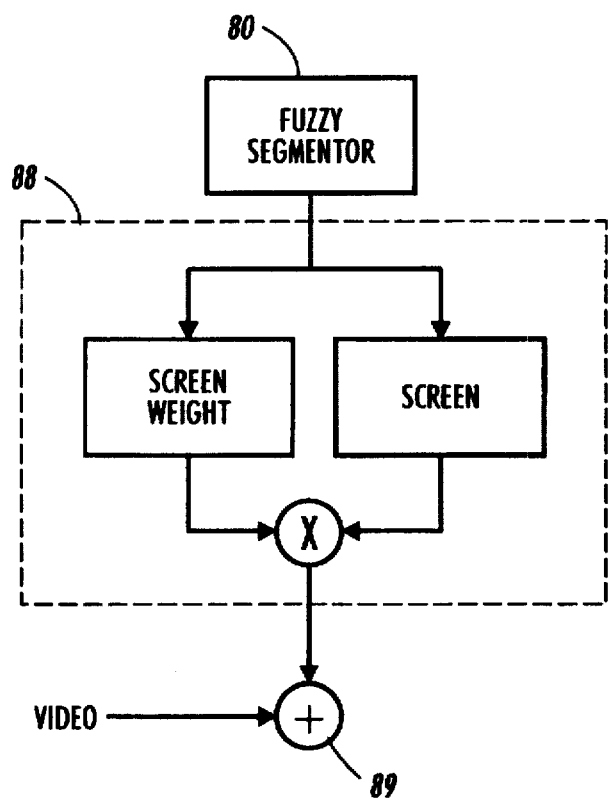
FIG. 20 is a block diagram illustrating a more detailed version of the system illustrated in FIG. 19.
Figure 21:
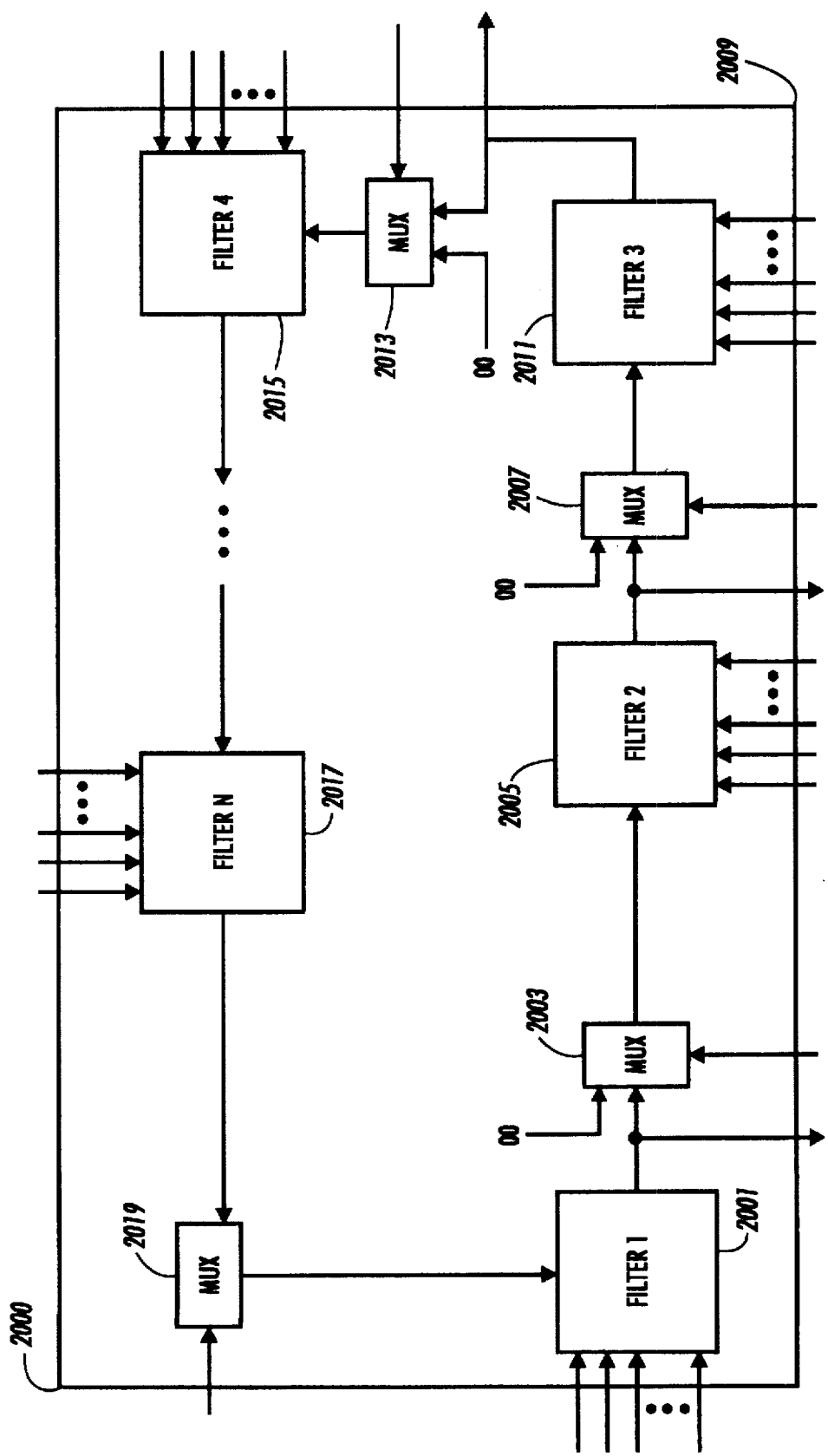
FIG. 21 illustrates a block diagram showing a chip having a plurality of cascadable filters.

A more detailed example of the application of fuzzy segmentation to screening is illustrated in FIG. 20. As illustrated in FIG. 20, the video signal or image data is fed into a fuzzy classifier 80 which classifies the image data according to the rules described above. The fuzzy image classifier 80 then generates a membership vector which is passed onto a screening generating circuit 88. The screen generating circuit 88 includes a screening weighting circuit 883, a screen value generating circuit 881, and a multiplier 885.

The screen weighting circuit 883 generates a weighting factor in response to the values in the membership vector so as to produce a no screen, a medium screen, or a high screen, or any screen therebetween, as discussed above. In other words, if the pixel had membership values for "edge," "low frequency halftone," "mid frequency halftone," and "other" of 0.8, 0.7, 0.1, and 0.3, respectively, the processing system would decode the membership vector and assign a membership value to the NO_SCREEN class of 0.8. Moreover, if the pixel had membership values for "black" and "white" of 0.4 and 0.1, respectively, the processing system would decode the membership vector and assign a membership value to the MEDIUM_SCREEN class of 0.4. Lastly, if the pixel had membership values for "pictorial" and "high frequency halftone" of 0.2 and 0.0, respectively, the processing system would decode the membership vector and assign a membership value to the FULL_SCREEN class of 0.2.

Thus, in this example, the screen amplitude for the pixel being processed would be equal to a scalar value of 0.286 (((1.0*0.2)+(0.5*0.4)+(0.0*0.8))/(0.2+0.4+0.8)).

The screen value generating circuit 881, which may be a lookup table or a hardwired circuit, produces a screen value based on the position of the pixel (image data) within the image. The weighting factor from the screen weighting circuit 883 and the screen value from screen value generating circuit 881 are multiplied together by multiplier 885 to produce the screen value to be added to the pixel. This screen value is added to the image data at adder 89.

The image data which is summed with the screen value corresponds to the same pixel as was classified by the fuzzy image classifier 80. In other words, the system illustrated in FIG. 20 also includes buffers (not shown) to insure that the pixel being processed corresponds to the correct membership vector being used to define the processing parameters.

As noted above, the problem of using a fuzzy image classification system to control digital filtering is two-fold. First, digital filtering is not a scalar function, but a matrix function. Secondly, there is a constraint on the matrix function; the filter must have gain of 1.0 at $(\omega_1\omega_2)=(0,0)$. This ensures that constant grey areas are not altered by filtering.

To solve this problem, the present invention, in the preferred embodiment, uses the weighted summation of several pre-defined filters to produced the filtered results. These filters are filters associated with a particular filter class; i.e., one filter class is enhance, one filter class is lowpass, and another filter class is "other". The digital filter of the present invention takes the form of $F_o = \Sigma \mu_i F_i$ where all of the $F_i$s correspond to the filters associated with each $i^{th}$ class (or classes) and $\mu_i$ corresponds to the membership of the image in the ith class, as determined by the fuzzy processing routine.

In a preferred embodiment of the present invention, the rules for the filtering classes are as follows:

If (pixel is "edge" or pixel is "pictorial" or pixel is "low frequency halftone"), then filter is ENHANCE; or If (pixel is "high frequency halftone"), then filter is LOWPASS.

Referring to the multiple "If's" in the above rules, the membership value of image in the class "ENHANCE" would be equal to the fuzzy value of the predicate, $\mu_{ENHANCE}$ (filter)=max($\mu_{edge}$(pixel), $\mu_{lowfreqhalftone}$(Pixel), $\mu_{pictorial}$(Pixel)); and the membership value of image in the class "LOWPASS" would be equal to the fuzzy value of the predicate, $\mu_{LOWPASS}$(filter)=max ($\mu_{highfreqhalftone}$(pixel)).

To implement the fuzzy screening, the processing system determines the membership value of the pixel in each of the classes associated with a particular screening process and assigns the maximum value as the membership value in the screening class. For example, if the pixel had membership values for "edge," "low frequency halftone," and "pictorial" of 0.6, 0.7, and 0.3, respectively, the processing system would decode the membership vector and assign a membership value to the ENHANCE class of 0.7. Moreover, if the pixel had membership values for "high frequency halftone" of 0.6, the processing system would decode the membership vector and assign a membership value to the LOWPASS class of 0.6.

To determine the actual coefficients for the various filters, the fuzzy processing system must ensure that the fuzzy filtering, resulting from the rule set, meets the constraint of a gain of 1.0 at the frequency $(\omega_1 \omega_2)=(0,0)$. To alleviate this problem, one of the output filter choices is assigned the bypass function. In bypass, Vout=Vin; i.e.; no filtering is done. Thus, the resulting filter, according to the concepts of the present invention is $F_o = \Sigma \mu_i F_i + (1 - \Sigma \mu_i) *F_B$ such that when the desired effect is the bypass filter, the value goes to zero and the effect of the filter $F_i$ is ignored.

It is noted that the enhancement filter amplifies all higher frequencies, and the lowpass filter attenuates the higher frequencies. The coefficient value, c, for the bypass filter can be determined using $C_{bypass} = 1 - \mu_{enhance}$(filter)$-\mu_{lowpass}$(filter) so that the output filter can be described as $F_o = \mu_{enhance}$(filter)*$F_{enhance} + \mu_{lowpass}$(filter)*$F_{lowpass} + C_{bypass} * F_{bypass}$.

Figure 18:
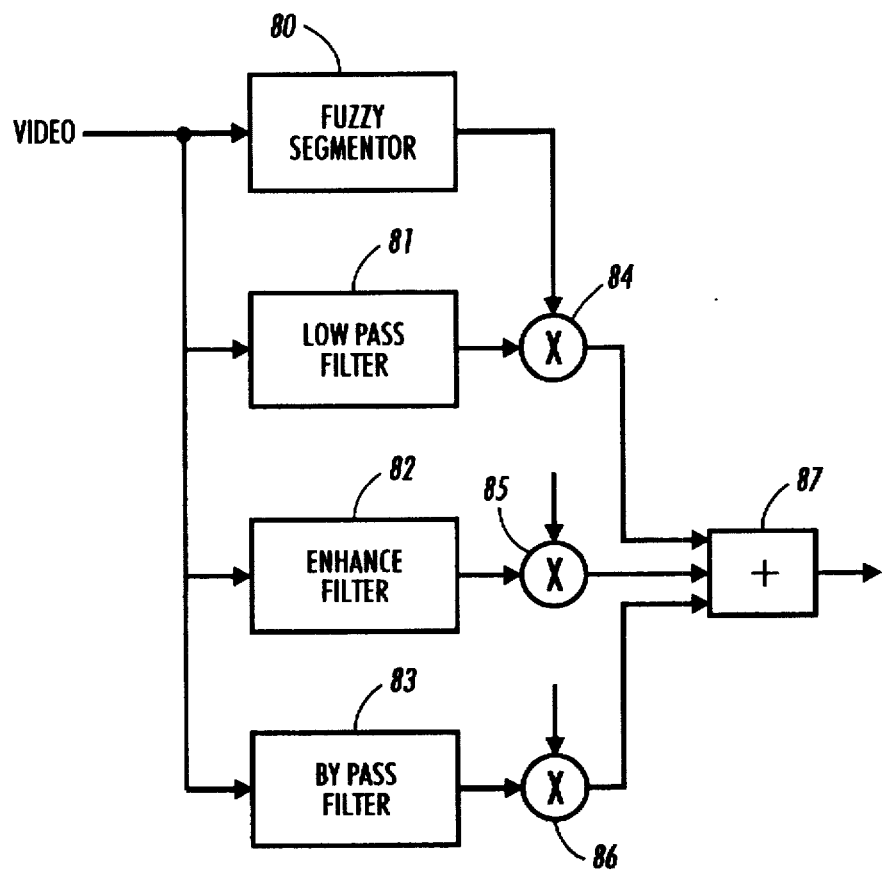
FIG. 18 is a block diagram of a digital filtering system incorporating the fuzzy classification process of the present invention.

An example of image processing an image using fuzzy classification with respect to filtering the image data is illustrated in FIG. 18. As illustrated in FIG. 18, video data or image data is fed into a fuzzy classifier 80, a lowpass filter 81, and an enhanced filter 82, and a bypass filter 83 in parallel. As described above, the fuzzy classifier 80 determines the membership vector of the pixel to be processed by the parallel set of filters. Note that this process includes buffers (not shown) to insure that the pixel being filtered corresponds to the correct membership vector being used to define the processing parameters.

Based upon this classification, the fuzzy classifier 80 will cause the overall filter to generate a set of coefficients which are applied to multipliers 84, 85, and 86. The coefficients will enable the overall filter to weight the output from the various filters according to the fuzzy image classification.

For example, as noted above, if the pixel had membership values for "edge," "low frequency halftone," and "pictorial" of 0.6, 0.7, and 0.3, respectively, the processing system would decode the membership vector and assign a membership value to the ENHANCE class of 0.7, which in turn is the filter coefficient assigned to the enhance filter 82 and fed to multiplier 85. Moreover, if the pixel had membership values for "high frequency halftone" of 0.6, the processing system would decode the membership vector and assign a membership value to the LOWPASS class of 0.6, which in turn is the filter coefficient assigned to the lowpass filter 81 and fed to multiplier 84. This leaves the generation of the coefficient for the bypass filter 83.

As noted above, the generated coefficients need a relationship such that the sum of the coefficients will not be greater than 1 so as to keep the gain of the overall output from the filters to be equal to 1. Thus, in the preferred embodiment of the present invention, the coefficient for the bypass filter is 1 minus the enhance coefficient minus the lowpass coefficient (in the example, 1–0.7–0.6=–0.3). This coefficient is applied to the multiplier 86. The weighted filter outputs are then fed into an adder 87 which adds all the outputs to produce a filtered pixel of image data which has been filtered according to its fuzzy image classification.

Although FIG. 18 illustrates the utilization of a fuzzy classifier with a plurality of different filters, the fuzzy classifier can also be utilized in connection with a modular time variant two-dimensional non-separable filter wherein the non-separable filter is made up of a plurality of separable filters.

The utilization of separable filters allows a non-separable filter of a particular form to be implemented in a cost effective manner. Moreover, a separable two-dimensional filter can be described as one-dimensional filter that acts in the vertical direction or slowscan direction followed by another one-dimensional filter acting in the horizontal or fastscan direction. Thus, the filter matrix can be described as the product of $F_{vh} = f_v * f_h$ wherein $F_{vh}$ is an N by M matrix, $f_v$ is a N length column vector (the vertical filter) and $f_h$ is a M length row vector (the horizontal filter).

If the matrix $F_{vh}$ cannot be represented using the above equation, the matrix is considered non-separable and the separable filter implementation cannot be used. However, if the N by M matrix is represented using a singular value decomposition such as $F_{vh} = U*S*V$, where U is N by N unitary matrix, S is an N by M diagonal matrix, and V is a M by M unitary matrix; a separable filter implementation can be used. Furthermore, if N and M are not equal, the above equation can be altered to $F_{vh} = U_r * S_r * V_r$, where Q=min(n,m), $U_r$ is a N by X submatrix of U, $S_r$ is a Q by Q submatrix of S, and $V_r$ is a M by Q submatrix of V. Putting this in summation form, the resulting representation will be $F_{vh} = \Sigma s(i) * u_i * v_i$, where i is greater than or equal to 1 but less than or equal to Q.

In this representation, the vector s(i) is a diagonal of the matrix $S_r$, $u_i$ is the $i^{th}$ column vector of $U_r$, and $v_i$ is the $i^{th}$ column vector of $V_r$. Each component is a separable filter similar to that described above with the exception of a gain factor s(i). In other words, any non-separable filter of length N by M can be represented as the weighted summation of Q separable N by M filters. Thus, to implement a non-separable filter using the weighted averages of several of the filters, the hardware becomes a conglomeration of Q separable filter modules, Q multipliers, and an adder. Such a hardware implementation, according to the concepts of the present invention is illustrated in FIG. 3.

Figure 3:
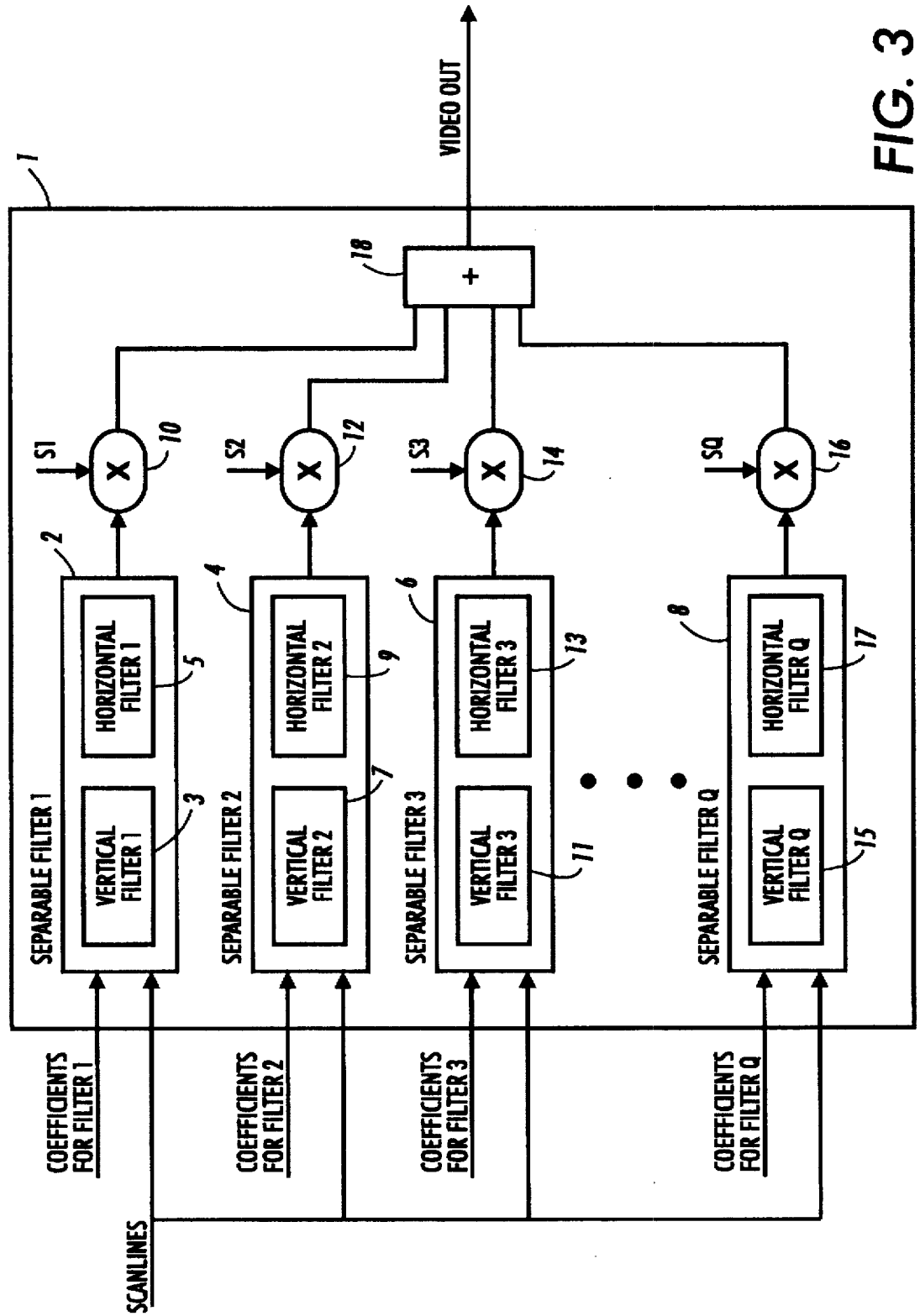
FIG. 3 is, a block diagram illustrating a non-separable two-dimensional filter according to one embodiment of the present invention.

The non-separable filter 1 of FIG. 3 includes a plurality of separable filters (2, 4, 6, and 8). Each of these separable filters include a vertical filter and a horizontal filter thus making the separable filter a separable two-dimensional filter. For example, the two-dimensional separable filter 2 includes a vertical filter 3 and a horizontal filter 5.

It is noted that if the non-separable filter 1 is a 3-dimensional filter, the individual separable filters 2, 4, 6, and 8 would each include 3 individual filters each filtering a separate dimension of the space. Such three dimensional filters are valuable when filtering moving image data such as in a motion picture or video recording.

The output of each separable filter is fed into a multiplier which multiplies the output of the separable two dimensional filter by a gain factor s(i). For example, the output from the two-dimensional separable filter 2 is fed into multiplier 10 and multiplied by the gain factor s1.

The gain factor can be a predetermined gain factor or a gain factor set by the fuzzy classifier described above. In the preferred embodiment of the present invention, the gain factor s(i) is set by the fuzzy classifier in accordance with the identified image type or class of the pixel being processed as described above.

The outputs from each of the multipliers are fed into an adder 18 which sums all the outputs to produce a two-dimensionally filtered pixel of image data. It is noted, that the summation of all of the gain factors s(i) is equal to 1 to ensure that the overall gain of the non-separable filter 1 is equal to 1. It is further noted that each separable filter receives the same pixel of image data in parallel. Moreover, each separable two-dimensional filter is supplied with the coefficients needed to perform the two-dimensional filtering on that particular pixel. These coefficients may be predetermined or they may be selected from a set of different coefficients depending on the image type or class of the pixel of image data being processed.

Figure 4:
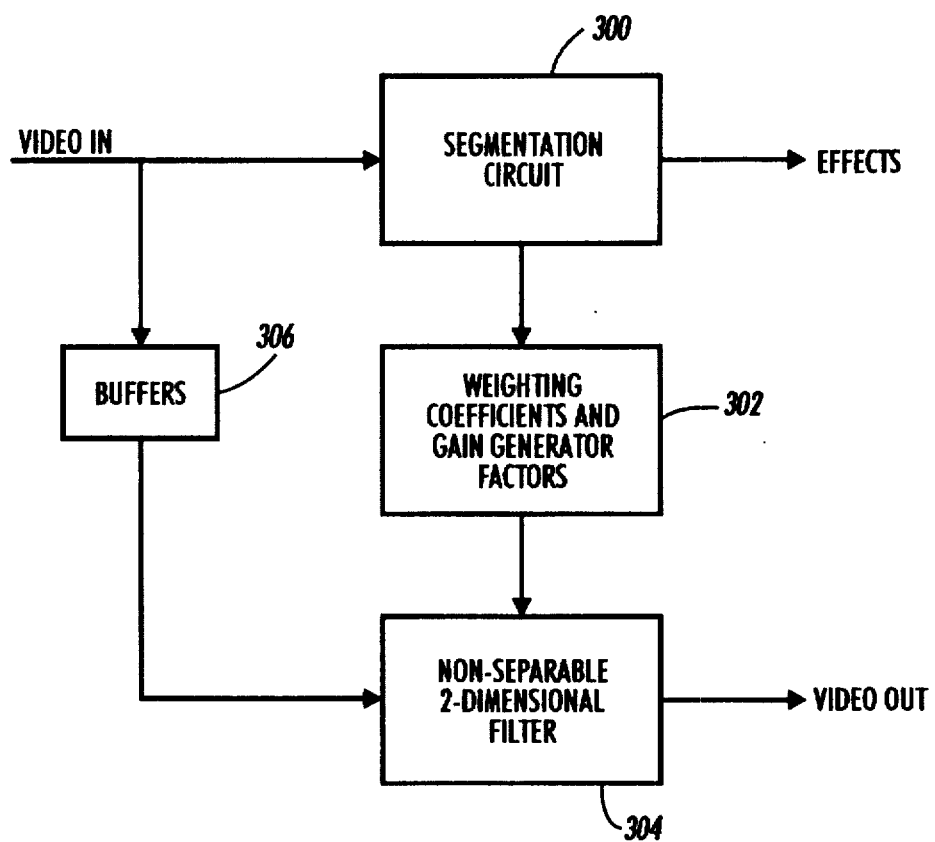
FIG. 4 is a block diagram illustrating an image processing system utilizing the two-dimensional filter of FIG. 3.

FIG. 4 illustrates the relationship of a non-separable two-dimensional filter in an image processing scheme. As illustrated in FIG. 4, video data is fed in parallel to a segmentation circuit 300 and buffers 306. The segmentation circuit 300 may either be a conventional image segmentation circuit or the fuzzy segmentation circuit discussed above. The segmentation circuit 300 determines the image type or class of the pixel of image data being processed. This image type or class information is fed into a weighting coefficients and gain factor generator 302 which generates the weighting coefficients and gain factors to be utilized by the non-separable two dimensional filter 304.

The segmentation circuit 300 also generates other information with respect to the image type or class which are called effects to be utilized further downstream in the image processing system. The non-separable two-dimensional filter 304 utilizes the weighting coefficients and gain factors to properly filter the pixels of image data received from buffer 306 to produce a two-dimensionally filtered pixel of image data.

When compared to a direct implementation of a separable N by M filter, the implementation of the non-separable filter utilizing a plurality of separable filters makes the design of an N by M filter very modular. This modularity makes the redesign of a new filter much faster as only the individual separable filter components need to be redone. In addition, if the separable module can be easily configured for many different sizes, the non-separable module inherits the same configurability.

Another major advantage of this type of implementation for a non-separable filter is that because of its modular nature, a filter can be implemented using the minimum amount of hardware. For example, assuming that an 11×15 non-separable filter is desired, after performing a singular value decomposition on the 11×15 non-separable filter, one realizes that only two elements of the gain vector s(i) are non zero and thus the filter matrix for the 11×15 filter has a rank of 2. This also would be true if the gain vector s(i) had only 2 elements that were much larger than all the other elements of gain vector s(i). In such a case, the filter can be implemented in hardware using only 2 separable filter blocks, not 11 blocks, as would be required if the filter matrix were of full rank.

In addition to being useful for implementing non-separable filters, the implementation of the present invention can be easily adapted to implement time-varying filters. The separable filters may not have the ability to time vary their coefficients hence the separable filters cannot be used to implement a time varying filter. However, using the concepts of the present invention, these filters can be used with some minimal additional hardware to create a time-varying non-separable filter.

For example, the non-separable filter described above can be made time-varying by making the vector s(i) a function of time and position. If the vector s(i) is not static, but instead is time-varying, the overall filter can be time-varying as well. If desired, the vector values can change on sample by sample or on a pixel by pixel basis. The time-varying effect can be attained by having only a few programmable gains; i.e., not all the coefficients need to be time-varying to have good time-varying characteristic. Although there is not total freedom in choosing the filter's performance given a certain time and location, the implementation of the present invention provides several degrees of freedom that greatly enhance the functionality of the filters sufficient for many practical applications.

For example, suppose that there are three different separable filters, one is a lowpass filter, one is a mid range (bandpass) filter, and one is a high pass filter. Furthermore, it is desirable to implement a combination of these filters that varies over time. Additionally, at some given instance, the lowpass filter is the desired effect. In such a scenario, the weighting on the lowpass filter would be 1 with zero weighting on the other two filters; i.e., the s(i) vector would equal [1 0 0]. At another point in time, it may be necessary to block the lowpass filter and attenuate the mid range filter by a factor of 0.5 and amplify the high pass filter by 1.2. This is accomplished by assigning the values of the s(i) vector to be equal to [0 0.5 1.2]. It is noted that a bypass filter would be included in these examples to ensure a gain of 1.0 as described above with respect to fuzzy processing.

An application where this flexibility provides a needed functionality is in providing filtering as required when using fuzzy image segmentation or fuzzy image processing. In the fuzzy situation, there are different pre-defined classes, each associated with a desired filter. Moreover when utilizing fuzzy image segmentation, a pixel is not assigned one class but is assigned a membership at each of the pre-defined classes. Dependent on the segmentation class vector, the desired filter will be a weighted summation of each of the associated filters.

More specifically, for example, in a situation utilizing a two class fuzzy classifier, the first class may require the object to be lowpass filtered and the second class requires the object to be high pass filtered. If the object is of the type of the first class, the lowpass filter is implemented; however, if the object of the second class, the high pass filter is implemented.

After fuzzy image segmentation, the object is determined to have a membership of 0.7 in the first class and 0.3 in the second class. Such a determination will result, using the concepts of the present invention, in the decision to implement a filter that is the summation of 0.7 of the lowpass filter and 0.3 of the high pass filter. Such an implementation can be easily accomplished utilizing the filter illustrated in FIG. 22 by setting the s(i) vector to be equal to [0.7 0.3 0]. If the next pixel is classified differently, its associated filter will be formed by changing the vector s(i) to produce the desired coherent filter.

Typically, a two-dimensional filter is implemented in hardware as a fixed size filter such as an N by M filter. Many times, the filter is not self-timed, which means that its output will be larger than the original input since convolution changes the size of a fixed length input. This not a desirable characteristic for processing documents where there is a size constraint due to the size of the display media; i.e., screen size or paper size. To address this situation, a self-timed two-dimensional filter is proposed.

A self-timed filter is one that does not require the external system to feed it additional information such as scanlines, pixels, or control signals before or after the input line or page has been processed to preserve the dimensions of the output page. Consequently, the number of scanlines and pixels per scanline in the output page is kept equal to the number of scanlines and pixels per scanline as the input page. The self-timed filter is not limited to a particular size, but can be programmed to any size less than a maximum N by M wherein N is the number of elements in the slowscan direction and M is the number of elements in the fastscan direction.

The self-timed two-dimensional filter of the present invention is accomplished using the separable implementation described above with respect to the non-separable two-dimensional filter. In this separable implementation, the input video undergoes filtering in the slowscan direction (vertical direction) followed by filtering in the fastscan direction (horizontal direction). Although the slowscan and fastscan filters may reside on the same chip, each filter acts independently of the other.

In a Q by R implementation (Q is less than or equal to N and R is less than or equal to M), the filter is connected to Q-1 external FIFO that are used to buffer video for the slowscan direction. In addition, window pointers, (tags that are passed along with the input video and describes pixel characteristics) which must correspond to the center slowscan element, are buffered by (Q-1)/2 FIFOs. The final video output of the filter can be filtered video or unfiltered video wherein the unfiltered video is produced during the bypass mode. The bypass path mode is chosen when there is not enough context to enable proper filtering such as around the perimeter of page.

During the processing of the input page, the filter will not produce any output while the first (Q-1)/2 scanlines are being input to the filter. However, on the scanline following the ((Q-1)/2)$^{th}$ scanline, the self-timed filter will begin to output video in the bypass mode. Due to a lack of context in the bypass mode, the center slowscan element, which is created by buffering the input video with (Q-1)/2 FIFOs, will exit the filter unchanged during the bypass mode. A Q by R filter requires Q lines of context before it can begin filtering. Consequently, the filter will remain in the bypass mode for (Q-1)/2 scanlines until it begins the Qth scanline at which time it will begin filtering and will output filtered video. It will stop filtering video when the last scanline of the input page has been processed.

Since the filter did not begin to output data until the scanline following the ((Q-1)/2)$^{th}$ scanline, (Q-1)/2 additional scanlines have to be created at the end of an input page to preserve the total number of scanlines in the output page. To address this situation, the self-timed two-dimensional N by M filter creates the (Q-1)/2 additional scanlines once the input page has ended to preserve the total number of scanlines in the output page.

In this implementation, a scan page is described by three signals; pagesync, linesync, and video valid. The first signal, pagesync, determines when a page is active. The second signal, linesync, determines when a scanline is active. The third signal is a video or pixel enable signal that indicates valid video during a scanline. The creation of (Q-1)/2 additional scanlines once the input page has ended is done by creating a new set of internal signals that function as the page active, line active, and video enable signals for the rest of the filter. These signals also control the flushing of the last ((Q-1)/2) scanlines of video that are stored in the FIFO.

Figure 5:
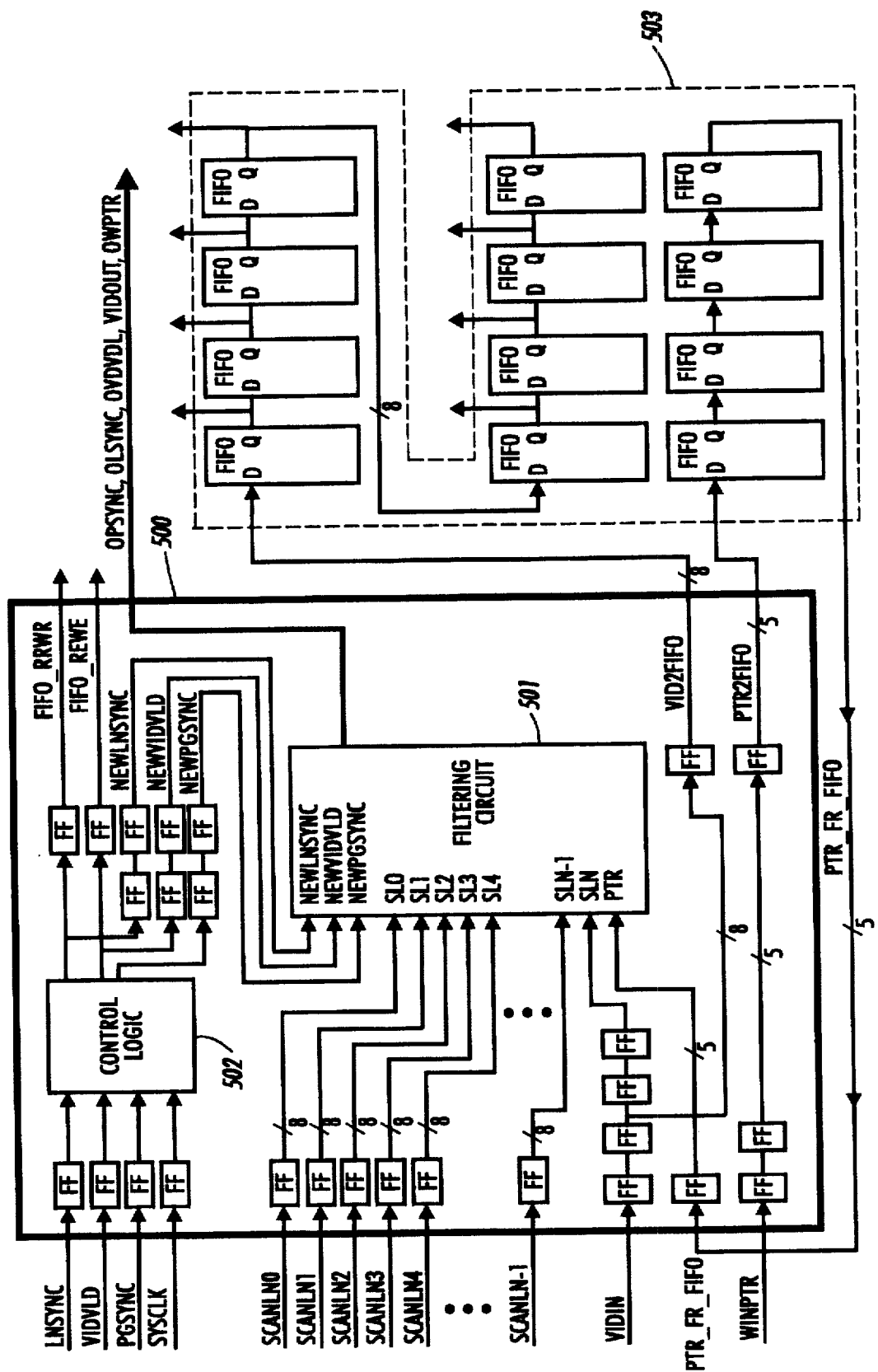
FIG. 5 is a block diagram illustrating a self timed non-separable two-dimensional filter according to a preferred embodiment of the present invention.

FIG. 5 illustrates an example of a self-timed 9×15 two-dimensional filter utilizing the concepts of the present invention. As illustrated in FIG. 5, the self-timed 9×15 filter 500 receives the input signals linesync, video valid, pagesync, and system clock. These signals are buffered and then fed into a control logic circuit 502 which generates the internal signal used for the self-timing mechanism. In the preferred embodiment of the present invention, the new internal signals are new linesync, new video valid, and new pagesync.

These three new signals are fed into the non-separable two-dimensional filtering circuit 501 which implements the concepts illustrated in FIG. 3. The self-timed non-separable two-dimensional filter 500 also receives 9 scanlines of video data wherein 8 scanlines of video data are fed into FIFOs prior to entering the non-separable two-dimensional filtering circuit 501.

In this situation, while the first 4 scanlines of the input page are being input into the self-timed two-dimensional filter 500, the self-timed two-dimensional filter 500 will not output any video data. When the self-timed two-dimensional filter 500 begins to process the fifth scanline of the input page, the filter 500 will begin to output video data in the bypass mode and continue to process video in this mode until the ninth scanline of the input page is received. At this time, the self-timed two-dimensional filter 500 will actually begin the filtering process.

The self-timed two-dimensional filter 500 will continue to filter video data until the last line of the active page has ended. At this time, the self-timed two-dimensional filter 500 will generate four additional linesync signals through internal signal new linesync, thereby flushing out the last four scanlines of video data from the FIFO buffers and outputting this video in the bypass mode.

Figure 6:
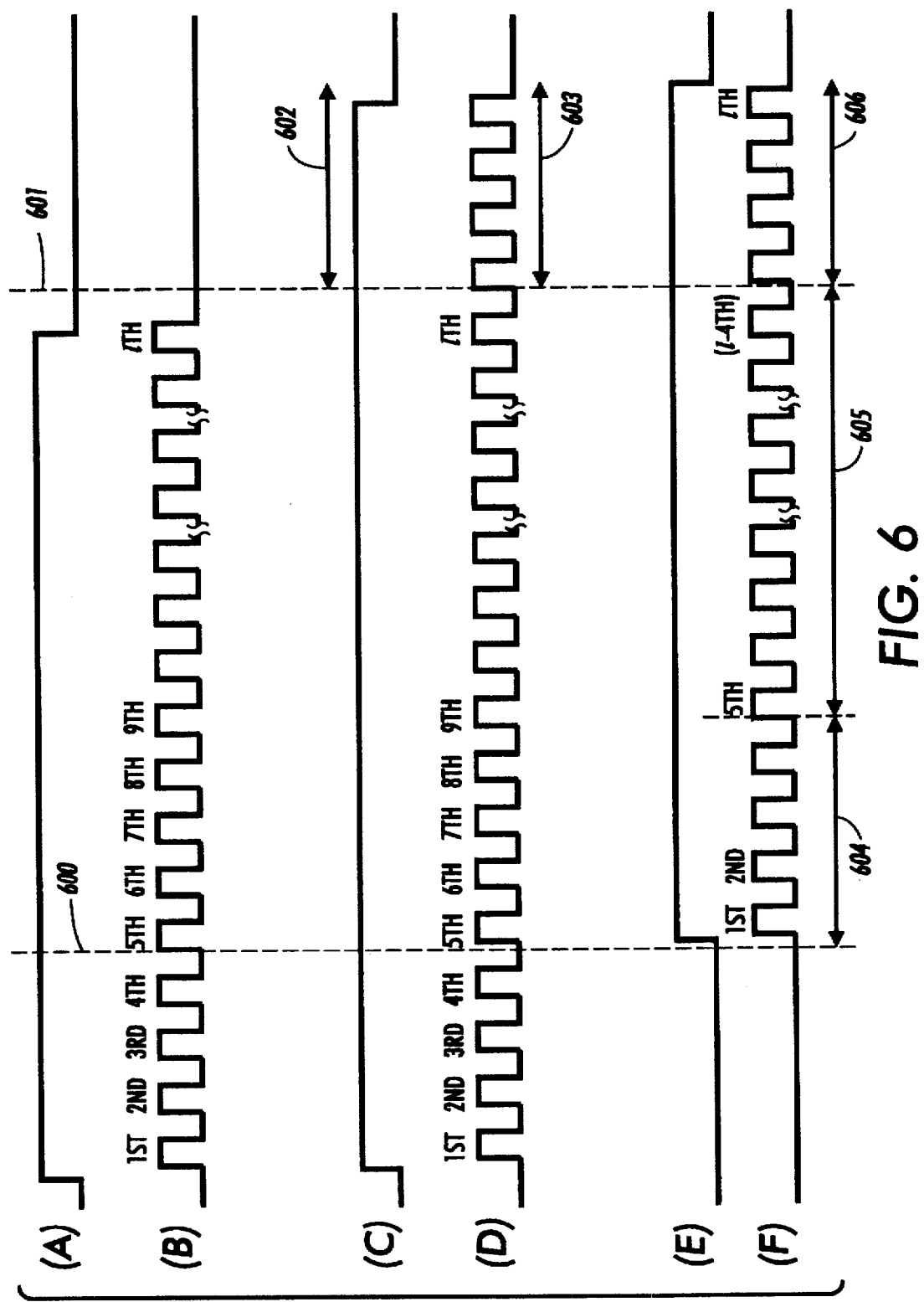
FIG. 6 is a timing diagram illustrating the sequence of events carried out by the self timed non-separable two-dimensional filter of FIG. 5.

To facilitate a better understanding of the concepts of the self-timed two-dimensional filter as illustrated in FIG. 5, a brief explanation of the timing aspect of this filter will be discussed below in reference to the timing diagram illustrated in FIG. 6. More specifically, FIG. 6 illustrates the input signals pagesync and linesync (A and B), the internal signals new pagesync and new linesync (C and D), and the output signals output pagesync and output linesync (E and F). Moreover, FIG. 6 illustrates the timing diagram of a self-timed two-dimensional filter having dimensions of 9 by 15.

As illustrated in FIG. 6, when the pagesync signal becomes active, the self-timed two-dimensional filter causes the internal new pagesync signal to also become active. Moreover, when the self-timed two-dimensional filter receives an active linesync signal, the self-timed two-dimensional filter causes the internal new linesync signal to also become active. However, in this example, the output pagesync signal and the output linesync signal are not caused to be active until a later time.

More specifically, the output pagesync signal does not become active until the fifth input linesync signal is received. At this point, the output pagesync signal becomes active and the first output linesync signal becomes active. This point in time also corresponds to the beginning of the first of the bypass mode wherein the self-timed two-dimensional filter outputs unfiltered video data since the filter has not received enough scanlines of video data to properly begin filtering. This bypass mode continues until the ninth input linesync signal is received wherein the self-timed two-dimensional filter switches to the filtering mode and outputs properly filtered image data.

At some later time, when the received pagesync signal becomes inactive indicating that the input page has ended, the self-timed two-dimensional filter causes the internal new pagesync signal to remain active for an additional four scanline cycles so as to flush out the buffers. Upon receiving an inactive pagesync signal, the self-timed two-dimensional filter switches from the filtering mode back to the bypass mode so as to flush out the FIFOS with unfiltered video data.

Although the two-dimensional filters of the present invention has been described with respect to a single filter architecture, the two-dimensional filters of the present invention can also be implemented as a plurality of cascadable filters. In other words, a large two-dimensional filter can be built by using many smaller cascadable filters. These cascadable filters are separable and symmetric and may be of any size N by M wherein N is the number of slowscan elements and M is the number of fastscan elements.

The cascadable filter has an extra cascade input and cascade output that are only used when multiple filters are cascaded together. Thus, any number of cascadable filters can be cascaded together to provide the filter size. For example, when two (NXM) filters are cascaded together, the maximum resulting filter can be an 2N−1×2M−1. Moreover, when three (NXM) filters are cascaded together, the maximum resulting filter can be 3N−1×3M−1, etc. Also, when two N filters are cascaded together and combined with a M filter, a (2N−1X M) filter is created.

To explain the cascadable concept more clearly, the implementation of a 7×15 filter will be utilized as an example. Moreover, in this example, the individual components of the two-dimensional filter (the slowscan filter and the fastscan filter) will be examined individually.

Figure 7:
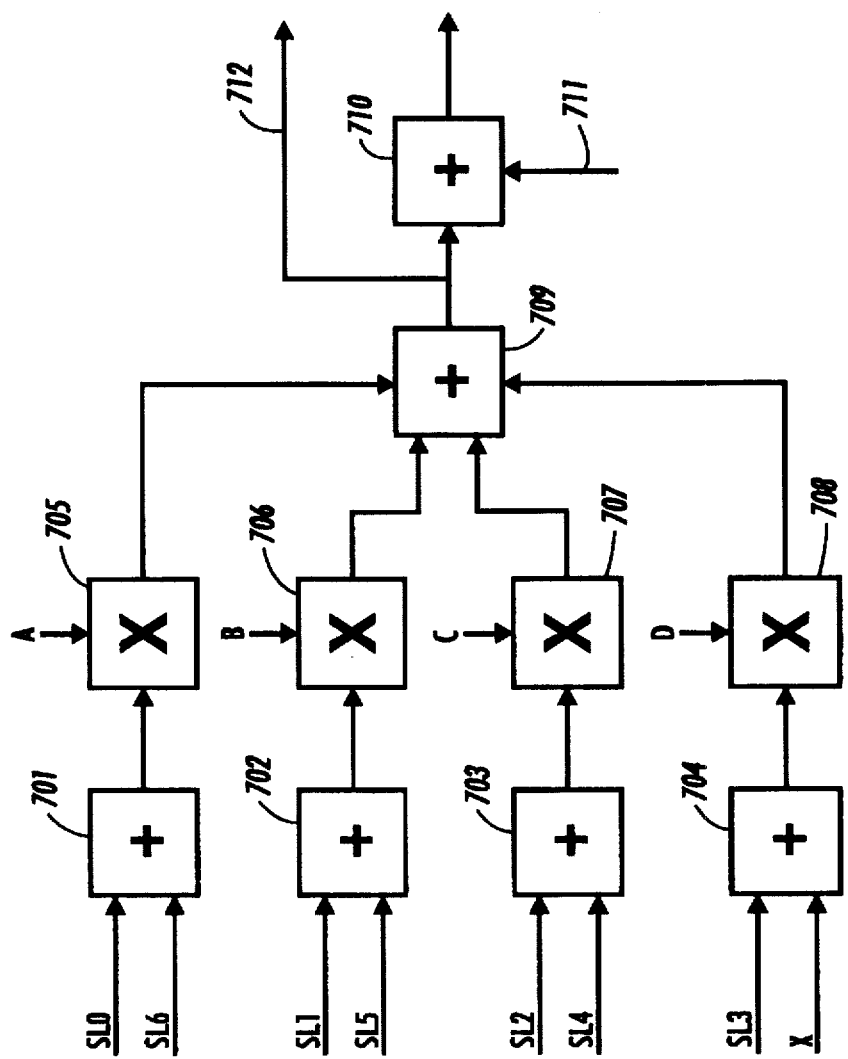
FIG. 7 is a block diagram illustrating a cascadable filter according to a preferred embodiment of the present invention.

As noted above, FIG. 7 illustrates a cascadable 7 element slowscan filter. This cascadable slowscan filter receives pixels of image data from 7 different scanlines wherein a pair of pixels of image data are fed to each adder 701, 702, 703, and 704. It is noted that since FIG. 7 illustrates a 7 element slowscan cascadable filter, the input X to adder 704 is tied to zero.

The output from each adder is fed into a separate multiplier 705, 706, 707, and 708 wherein the individual sums are multiplied by the weighting coefficients A, B, C, D, respectively. The weighted results from the multipliers are then fed into adder 709 which produces a 7 element slowscan filtered pixel of image data. The output from adder 709 is fed to adder 710 which sums the 7 element slowscan filtered pixel of image data with the filtered image data from another cascadable slowscan filter. This input can be tied to zero if it is not desirable to make a filter greater than 7 elements.

Suppose that it is desirable to cascade 2 cascadable slowscan filters to create one that is 15 elements wide. More specifically, it is desirable to cascade 2 slowscan filters which will generate image data that is represented by a value that is equal to A(line 0+line 14)+B(line 1+line 13)+C(line 2+line 12) +D(line 3+line 11)+E(line 4+line 10) +F(line 5+line 9)+G(line 6+line 8)+H(line 7).

Figure 8:
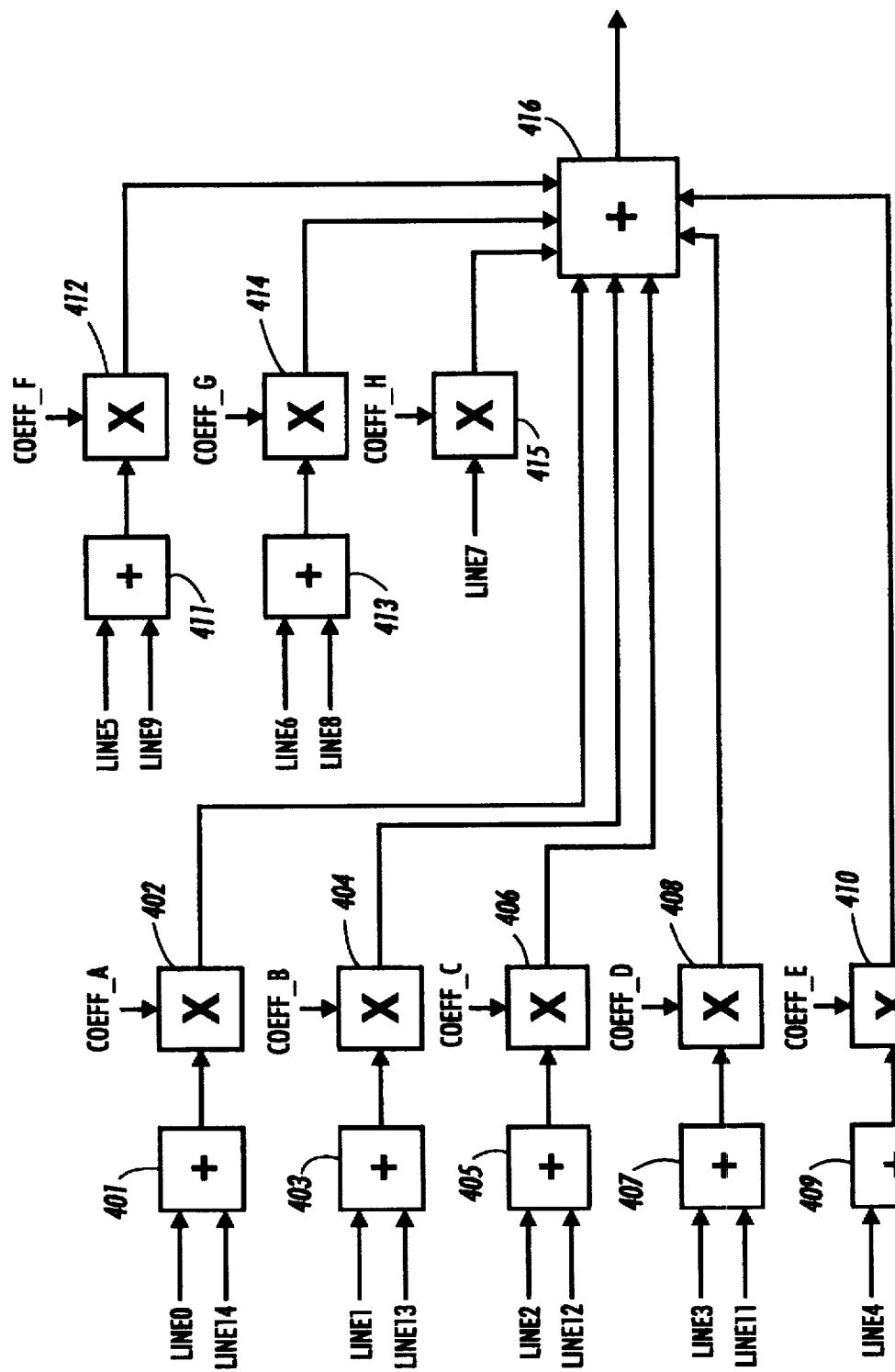
FIG. 8 is a block diagram illustrating a convention filter.

Conventionally, such a 15 element slowscan filter would be implemented as illustrated in FIG. 8. In other words, each of the 8 operations described above to generate the proper value for the pixel of image data would be implemented in parallel and fed to a single adder 16. However, as noted above, such a large filter can be implemented utilizing a plurality of cascadable filters.

Figure 9:
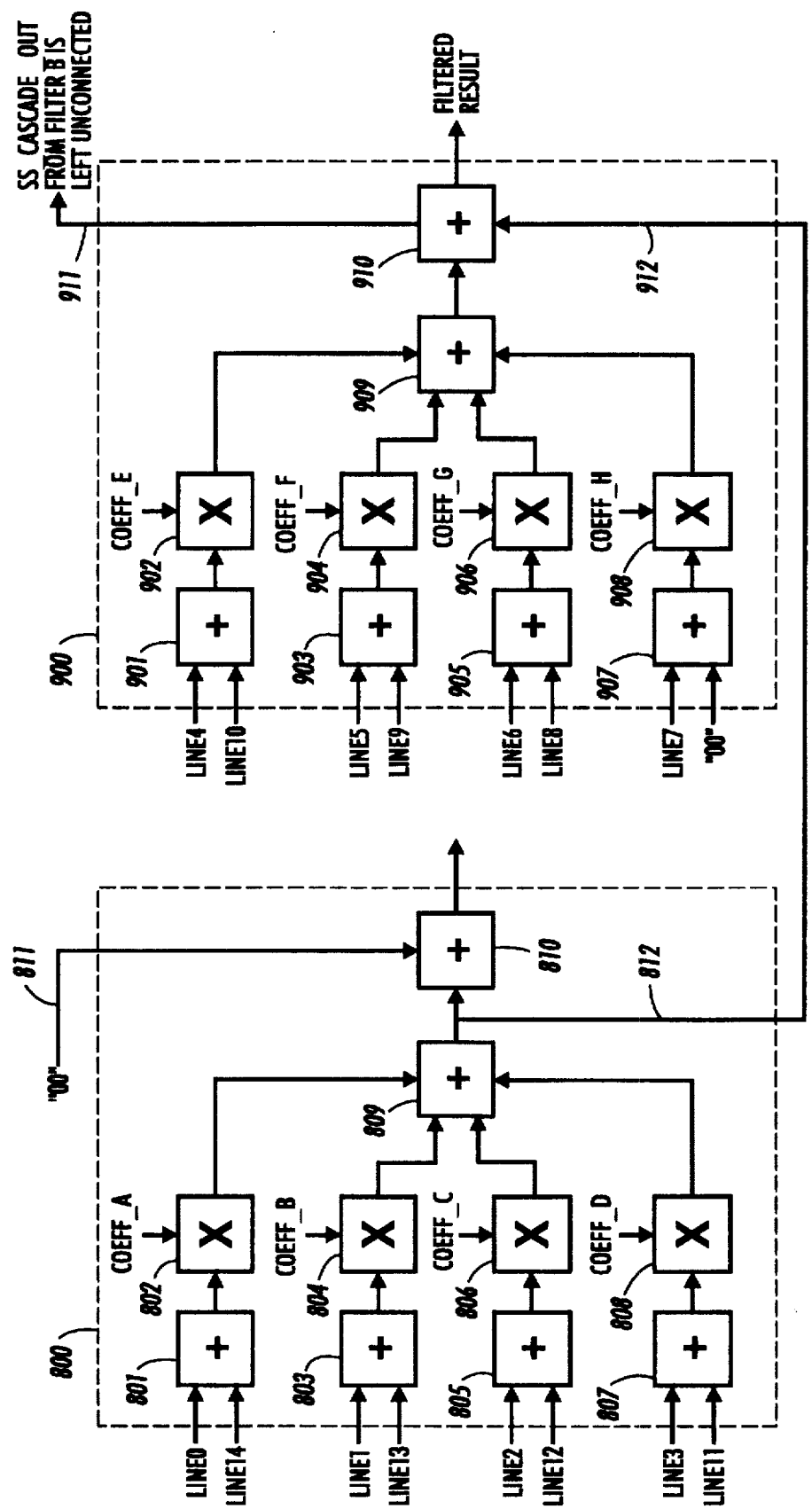
FIG. 9 is a block diagram illustrating the formation of a single filter utilizing two cascadable filters.

More specifically, as illustrated in FIG. 9, the 15 element slowscan filter can be implemented utilizing two smaller cascadable filters 800 and 900. In this example, each cascadable filter is similar to the cascadable filter as discussed above with respect to FIG. 7. However in this case, the cascadable filter 900 receives the cascadable out filtered image data from cascadable filter 800 and inputs this cascaded filtered image data into adder 910. Adder 910 adds together the cascaded filtered image data from cascadable filter 800 with the filtered image data produced by the various elements of cascadable filter 900 to produce a final filtered result which represents a pixel of image data which has been filtered by a 15 element slowscan filter.

In other words, the output from adder 910 generates a value which is represented by the equation given above. Moreover, the inclusion of an additional cascadable filter, as illustrated in FIG. 7, can result in a 23 element slowscan filter. Moreover, the inclusion of 2 more cascadable filters, as illustrated in FIG. 7, can result in a 31 element slowscan filter.

Figure 10:
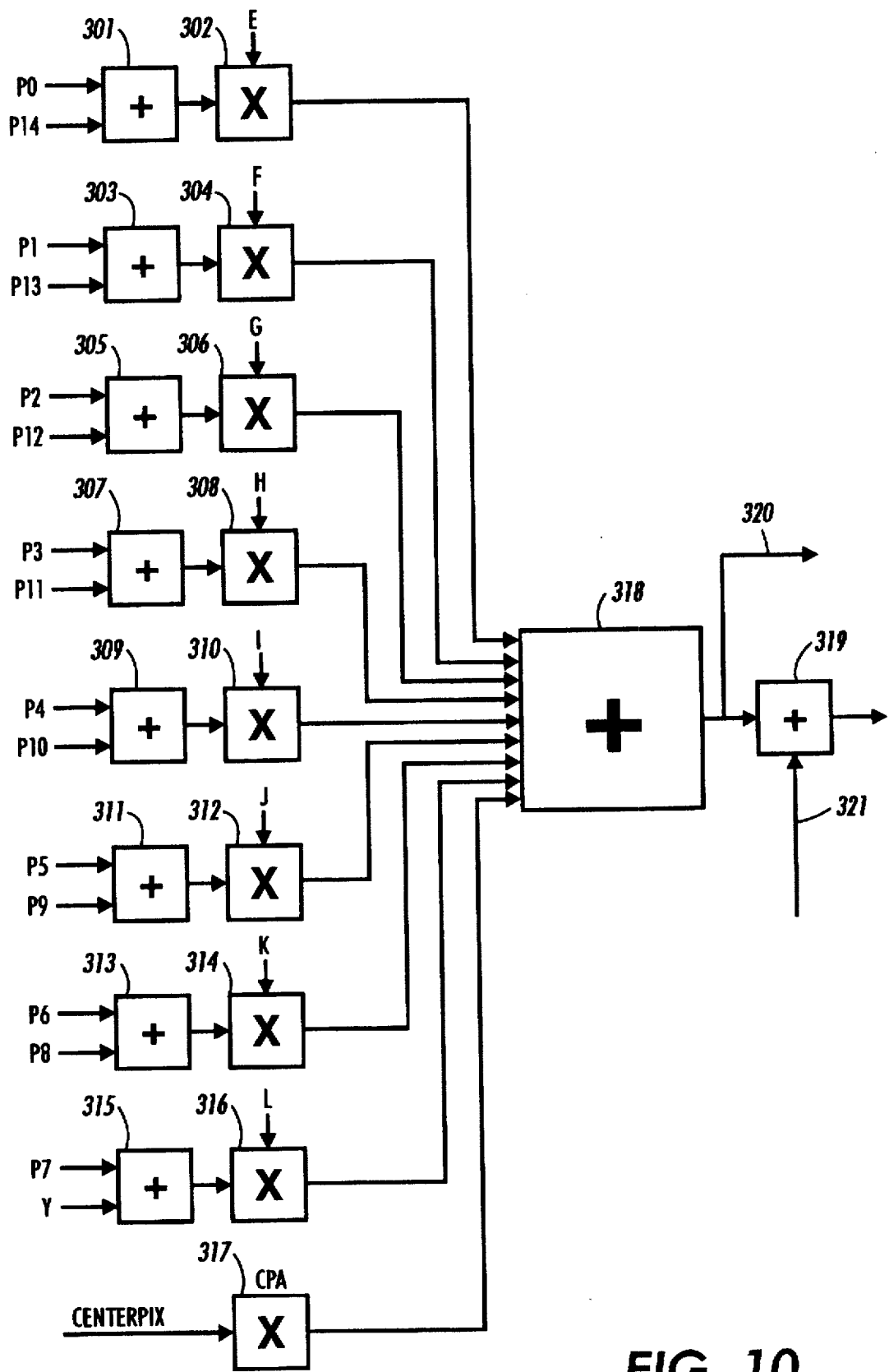
FIG. 10 is a block diagram illustrating a cascadable fastscan filter.
Figure 11:
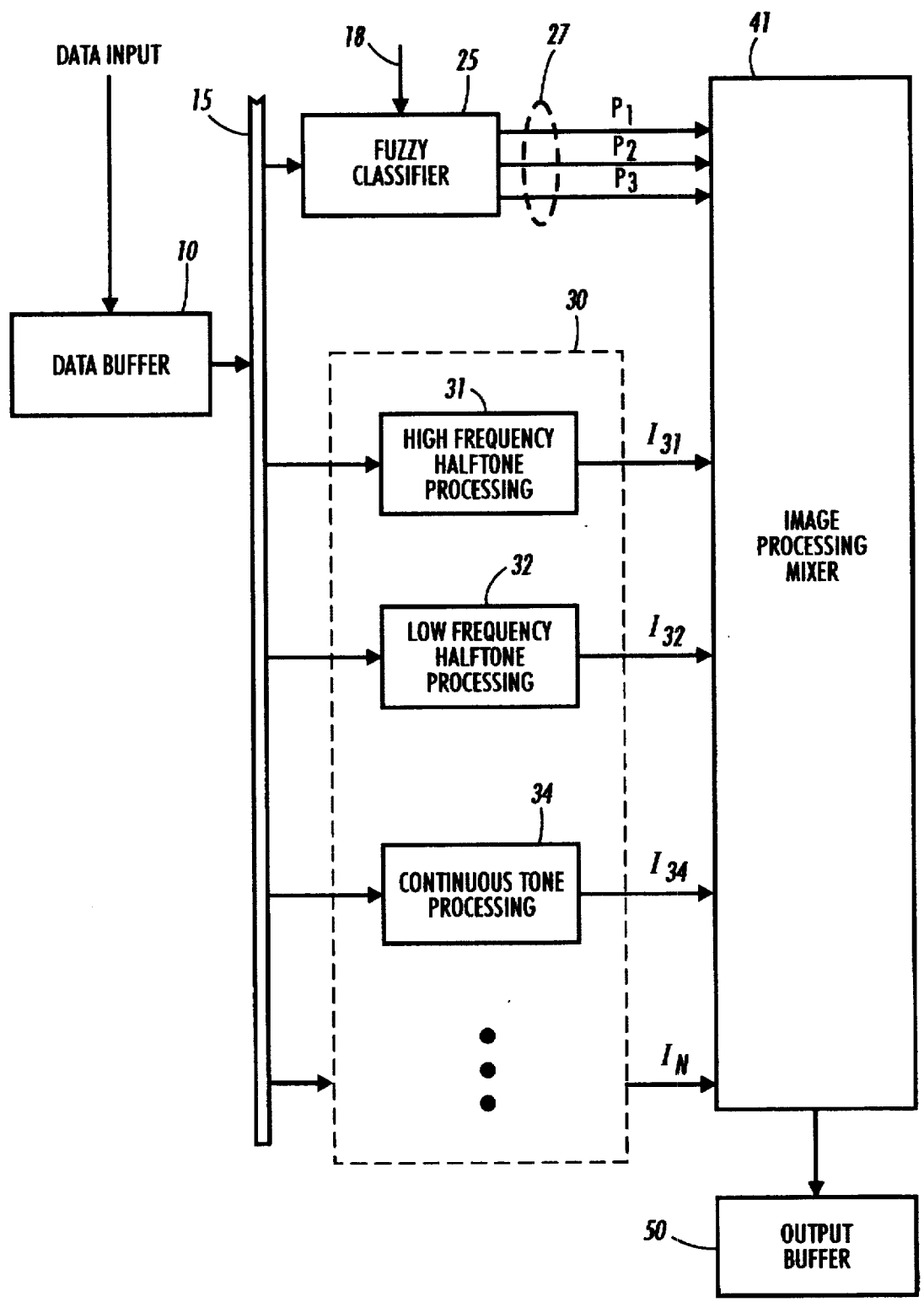
FIG. 11 is a block diagram illustrating a conventional image processing system incorporating probabilistic segmentation.
Figure 12:
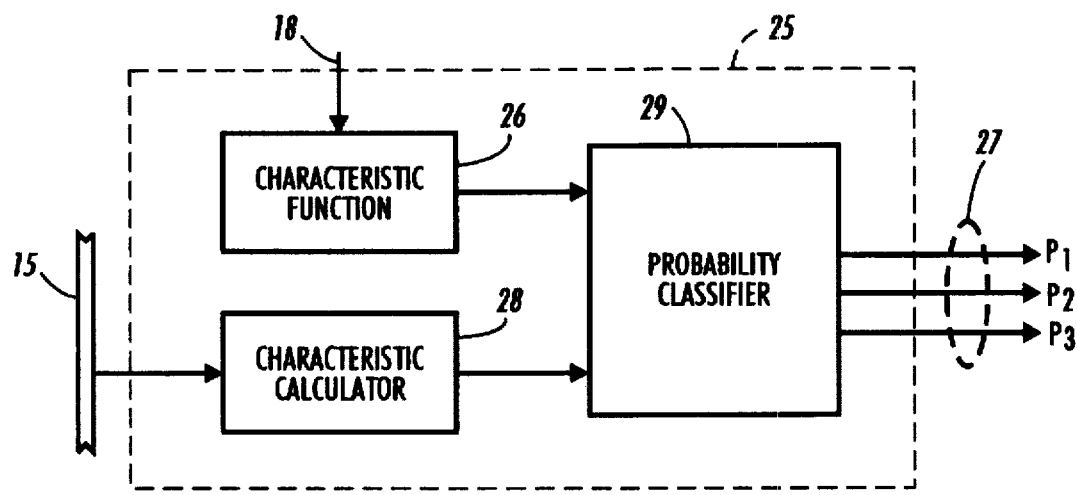
FIG. 12 is a block diagram detailing the probabilistic segmentor shown in FIG. 11.
Figure 13:
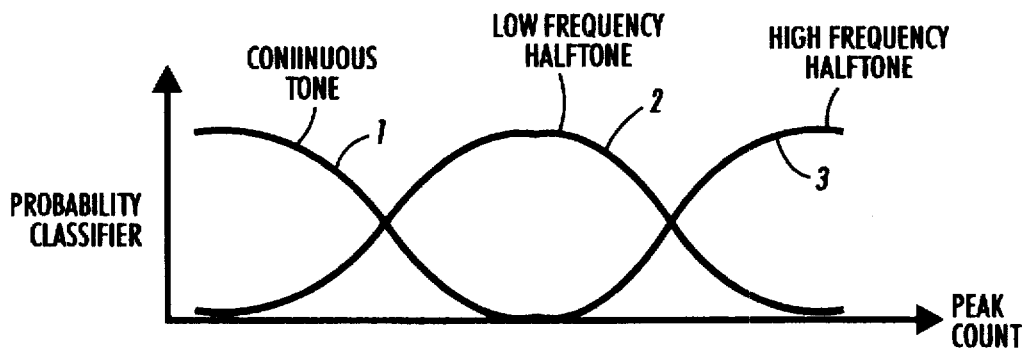
FIG. 13 shows an example of a characteristic function of the image property, peak count.
Figure 14:
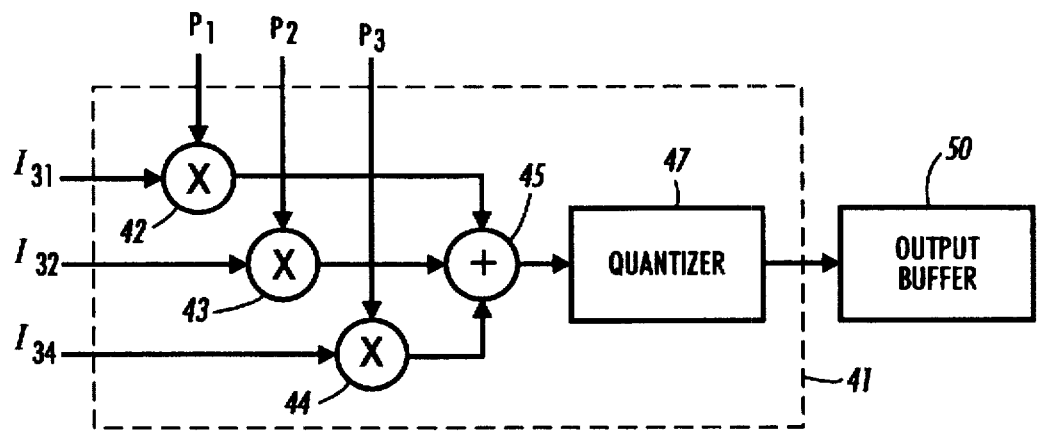
FIG. 14 is a block diagram illustrating in detail the image processing mixer shown in FIG. 11.
Figure 15:
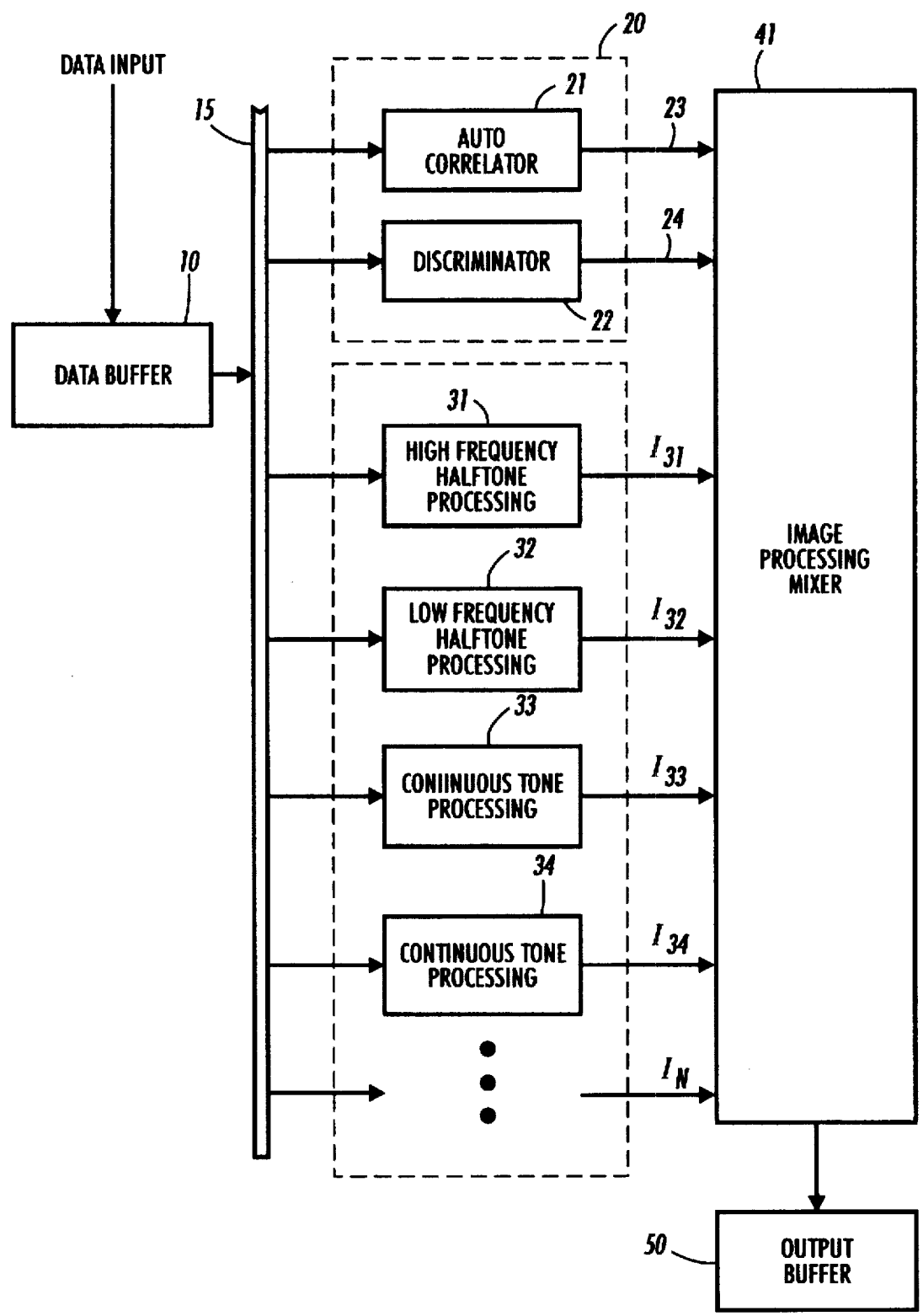
FIG. 15 is a block diagram illustrating a "prior art" image processing system.
Figure 16:
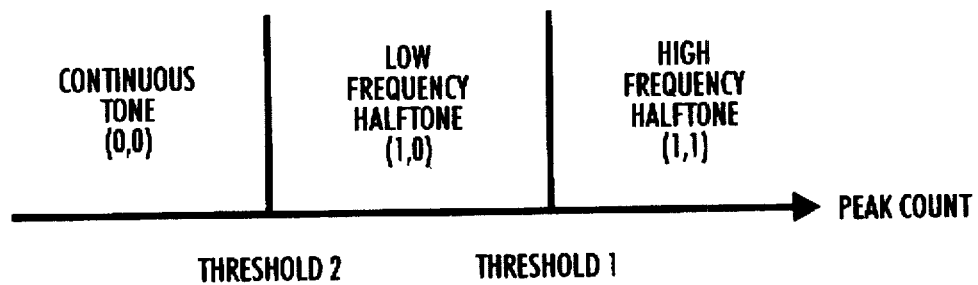
FIG. 16 shows the thresholding technique used by the "prior art" to determine an appropriate image processing technique for images having different image types.
Figure 17:
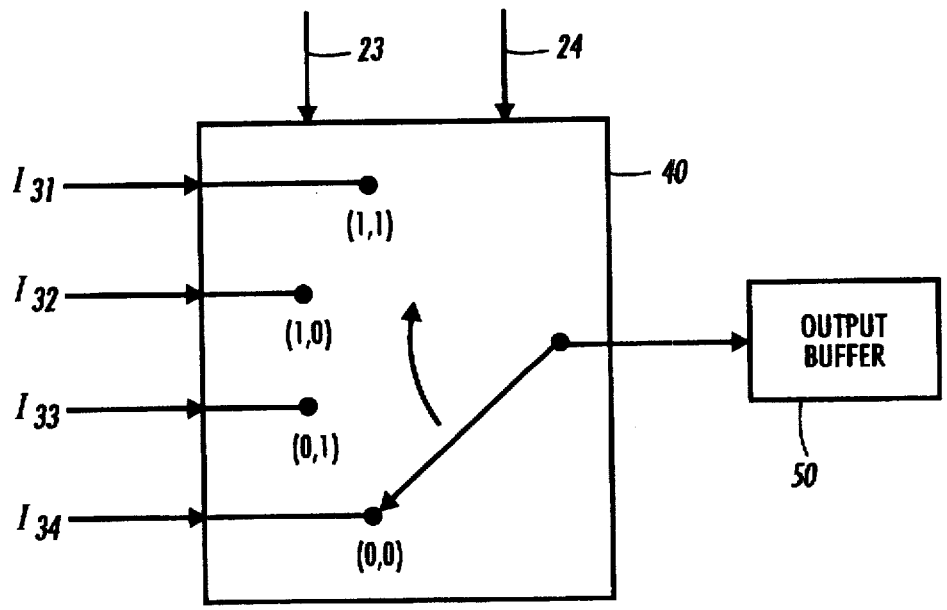
FIG. 17 is a block diagram illustrating in detail the "prior art" image processing control circuit shown in FIG. 15.

Not only can the cascadable filter concept be applied to the slowscan direction, it is also applicable to the fastscan direction. FIG. 10 illustrates a fastscan cascadable filter wherein input 321 represents the cascadable output from another fastscan cascadable filter. If one desires that the present cascadable filter, as illustrated in FIG. 10, to remain a 15 element fastscan filter, the input 321 is tied to zero and the input to adder 315 is also tied to zero.

If it is desired to implement a 31 element wide fastscan filter, one would cascade together two fastscan filters as illustrated in FIG. 10 wherein the output 320 of the first cascadable filter would be input to the input terminal that is equivalent to the input terminal 321 in the second cascadable fastscan filter. In this way, two smaller fastscan filters can be cascaded to create a larger fastscan filter.

An example of a chip having a cascadable filtering architecture is illustrated in FIG. 25. The filtering chip 2000 includes N cascadable filters (2001, 2005, 2011, 2015, and 2017). The filtering chip 2000 also includes N multiplexers (2003, 2007, 2013, and 2019) wherein a single multiplexer is connected between two cascadable filters. The multiplexers receive the cascadable filtered image data from the downstream filter (i.e., multiplexer 2003 receives the cascadable filtered image data from filter1 2001) and a zero value at the multiplexers two input terminals.

If the output of the downstream filter is to cascaded into the next filter, a logically enabling signal is received by the multiplexer so that the filtered data is input into the upstream filter. For example, if filter1 2001 and filter2 2005 where to be cascaded together, multiplexer 2003 would receive a logically enabling signal, causing multiplexer 2003 to pass the filtered output of filter1 2001 to filter2 2005. If the two filters were not cascaded together, the multiplexer 2003 would receive a logically non-enabling signal, causing multiplexer 2003 to pass on a zero value to filter2 2005, thereby preventing the cascading of the two filters.

Although the present invention has been described in detail above, various modifications can be implemented without departing from the spirit of the present invention. For example, the preferred embodiment of the present invention has been described with respect to a xerographic printing system; however, these fuzzy methods and filters are readily implemented in a thermal inkjet system, a display system, or other image processing system.

Moreover, the image processing system of the present invention can be readily implemented on a general purpose computer, a personal computer or workstation. The image processing system of the present invention can be readily implemented on an ASIC, thereby enabling the placement of this process in a scanner, electronic subsystem, printer, or display device.

The present invention has been described with respect to a video range of 0 to 255. However, it is contemplated by the present invention that the video range can be any suitable range to describe the grey level of the pixel being processed. Furthermore, the present invention is readily applicable to any image processing system, not necessarily a binary output device. It is contemplated that the concepts of the present invention are readily applicable to a four-level output terminal or higher.

Also, the present invention has been described, with respect to the fuzzy classification and fuzzy processing routines, that the scalar values are determined using the weighted sum of the centriod method since the centriods in the preferred embodiment are non-overlapping (the classes are non-overlapping). However, the present invention is readily applicable to a system with overlapping classes. Such an extension is readily known to those skilled in the art of fuzzy logic.

Lastly, the present invention has been described with respect to a monochrome or black/white environment. However, the concepts of the present invention are readily applicable to a color environment. Namely, the image processing operations of the present invention can be applied to each color space value representing the color pixel.

While the invention has been described with reference to various embodiments disclosed above, it is not cofined to the details set forth above, but is intended to cover such modifications or changes as may come within the scope of the attached claims.

What is claimed is:

1. A self-timed image processing device for filtering digital image data, comprising:

a timing circuit to convert a received line sync signal and a received page sync signal to a new line sync signal and a new page sync signal; and a N×M filter to filter digital data based on said new line sync signal and said new page sync signal; N being a value representing a filter dimension in a slow scan direction, M being a value representing a filter dimension in a fast scan direction;

said timing circuit causing the self-timed image processing device to output (N−1)/2 scanlines of unfiltered digital image data after the received page sync signal indicates an end of an input page.

2. The self-timed image processing device as claimed in claim 1, wherein said timing circuit causes the self-timed image processing device to output unfiltered digital image data after ((N−1)/2)+1 received line sync signals have been received and the received page sync signal indicates a beginning of an input page.

3. The self-timed image processing device as claimed in claim 2, wherein said timing circuit causes the self-timed image processing device to output filtered digital image data after N received line sync signals have been received and the received page sync signal indicates a beginning of an input page.

4. The self-timed image processing device as claimed in claim 1, further comprising:

a plurality of scanline buffers to buffer scanlines of digital image data prior to filtering.

5. A method for filtering digital image data, comprising the steps of:

(a) receiving line sync signals;

(b) receiving a page sync signal;

(c) receiving a plurality of scanlines of digital image data;

(d) filtering, using a N×M filter, the received scanlines of digital image data and outputting filtered digital image data; and (e) bypassing said step (d) when the received page sync signal indicates a beginning of an input page and ((N−1)/2)+1 line sync signals have been received.

6. The method as claimed in claim 5, further comprising the steps of:

(f) bypassing said steps (d) and outputting (N−1)/2 scanlines of unfiltered digital image data when the received page sync signal indicates an end of an input page.

7. The method as claimed in claim 6, further comprising the set of:

(g) bypassing said step (d) and outputting no digital image data when the received page sync signal indicates the beginning of the input page and before ((N−1)/2)+1 line sync signals have been received.

8. The method as claimed in claim 7, further comprising the step of:

(h) buffering the received plurality of scanlines of digital image data.

9. A filter, comprising:

a plurality of buffers to receive digital image data to be filtered; and filter means for filtering the buffered digital image data and outputting the digital image data based on a state of a received page sync signal and received line sync signals;

said filter means filtering the buffered digital data and outputting filtered digital image data when the received page sync signal indicates an input page is being received and when N line sync signals have been received, N being a value representing a filter dimension in a slowcan direction;

said filter means bypasses the filtering operation and outputs unfiltered digital image data when the received page sync signal indicates when the input page is being received and when ((N−1)/2)+1 line sync signals have been received.

10. The filter as claimed in claim 9, wherein said filter means bypasses the filtering operation and outputs (N−1)/2 scanlines of unfiltered digital image data when the received page sync signal indicates an end of the input page.

11. The filter as claimed in claim 10, wherein said filter means bypasses the filtering operation and outputs no digital image data when the received page sync signal indicates when the input page is being received and before ((N−1)/2)+1 line sync signals are received.

12. A method for filtering comprising the steps of:

(a) buffering received digital image data;

(b) filtering the buffered digital data;

(c) outputting filtered digital image data when a received page sync signal indicates an input page is being received and when N line sync signals have been received, N being a value representing a filter dimension in a slowscan direction; and (d) bypassing said steps (b) and (c) and outputting unfiltered digital image data when the received page sync signal indicates when the input page is being received and when ((N−1)/2)+1 line sync signals have been received.

13. The method as claimed in claim 12, further comprising the step of:

(e) bypassing said steps (b), (c), and (d) and outputting (N−1)/2 scanlines of unfiltered digital image data when the received page sync signal indicates an end of the input page.

14. The method as claimed in claim 13, further comprising the step of:

(f) bypassing said steps (b), (c), (d), and (e), and outputting no digital image data when the received page sync signal indicates when the input page is being received and before ((N−1)/2)+1 line sync signals are received.

* * * * *